US010177794B1

(12) United States Patent
Rahul et al.

(10) Patent No.: US 10,177,794 B1
(45) Date of Patent: Jan. 8, 2019

(54) METHOD AND APPARATUS FOR ERROR DETECTION AND CORRECTION

(71) Applicant: Xilinx, Inc., San Jose, CA (US)

(72) Inventors: Kumar Rahul, Hyderabad (IN); Amarnath Perla, Hyderabad (IN); Santosh Yachareni, Hyderabad (IN)

(73) Assignee: XILINX, INC., San Jose, CA (US)

(*) Notice: Subject to any disclaimer, the term of this patent is extended or adjusted under 35 U.S.C. 154(b) by 0 days.

(21) Appl. No.: 15/372,221

(22) Filed: Dec. 7, 2016

(51) Int. Cl.
*G11C 29/00* (2006.01)
*H03M 13/00* (2006.01)
*G06F 11/10* (2006.01)
*G11C 29/52* (2006.01)
*H03M 13/15* (2006.01)

(52) U.S. Cl.
CPC ....... *H03M 13/616* (2013.01); *G06F 11/1068* (2013.01); *G11C 29/52* (2013.01); *H03M 13/1575* (2013.01)

(58) Field of Classification Search
CPC ......... H03M 13/2921; H03M 13/2963; H03M 13/29; H03M 13/2966; H03M 13/098; H03M 13/152; H03M 13/2909; H03M 13/2936; H03M 13/2912; H03M 13/2918; H03M 13/2927; H03M 13/3707; H03M 13/19; H03M 13/036; H03M 13/2742; H03M 13/2906; G06F 11/00
See application file for complete search history.

(56) References Cited

U.S. PATENT DOCUMENTS

| | | | | |
|---|---|---|---|---|
| 8,972,833 B1* | 3/2015 | Rahul | ................ | H03M 13/098 714/785 |
| 8,972,835 B1* | 3/2015 | Rahul | ................... | H03M 13/19 714/800 |
| 2008/0092026 A1* | 4/2008 | Brandman | .......... | G06F 11/1072 714/793 |
| 2013/0132793 A1* | 5/2013 | Ha | .................... | H03M 13/2912 714/755 |
| 2014/0059403 A1* | 2/2014 | Sommer | ............. | G06F 11/1012 714/758 |
| 2016/0149592 A1* | 5/2016 | Kumar | .............. | H03M 13/2921 714/755 |

* cited by examiner

*Primary Examiner* — Guerrier Merant
(74) *Attorney, Agent, or Firm* — David O'Brien

(57) ABSTRACT

An integrated circuit (IC) includes an encoder configured to receive input data including a plurality of data bits. The encoder includes a parity computation matrix circuit configured to arrange the data bits according to a matrix format to generate a parity computation matrix. A parity computation circuit is configured to compute a plurality of parity computation row terms corresponding to rows of the parity computation matrix respectively, compute a plurality of parity computation column terms corresponding to columns of the parity computation matrix respectively, and compute parity bits using the parity computation row terms and parity computation column terms. Write data including the data bits and the parity bits are provided to a write circuit. The write circuit writes the write data to a memory cell array in a memory.

20 Claims, 36 Drawing Sheets

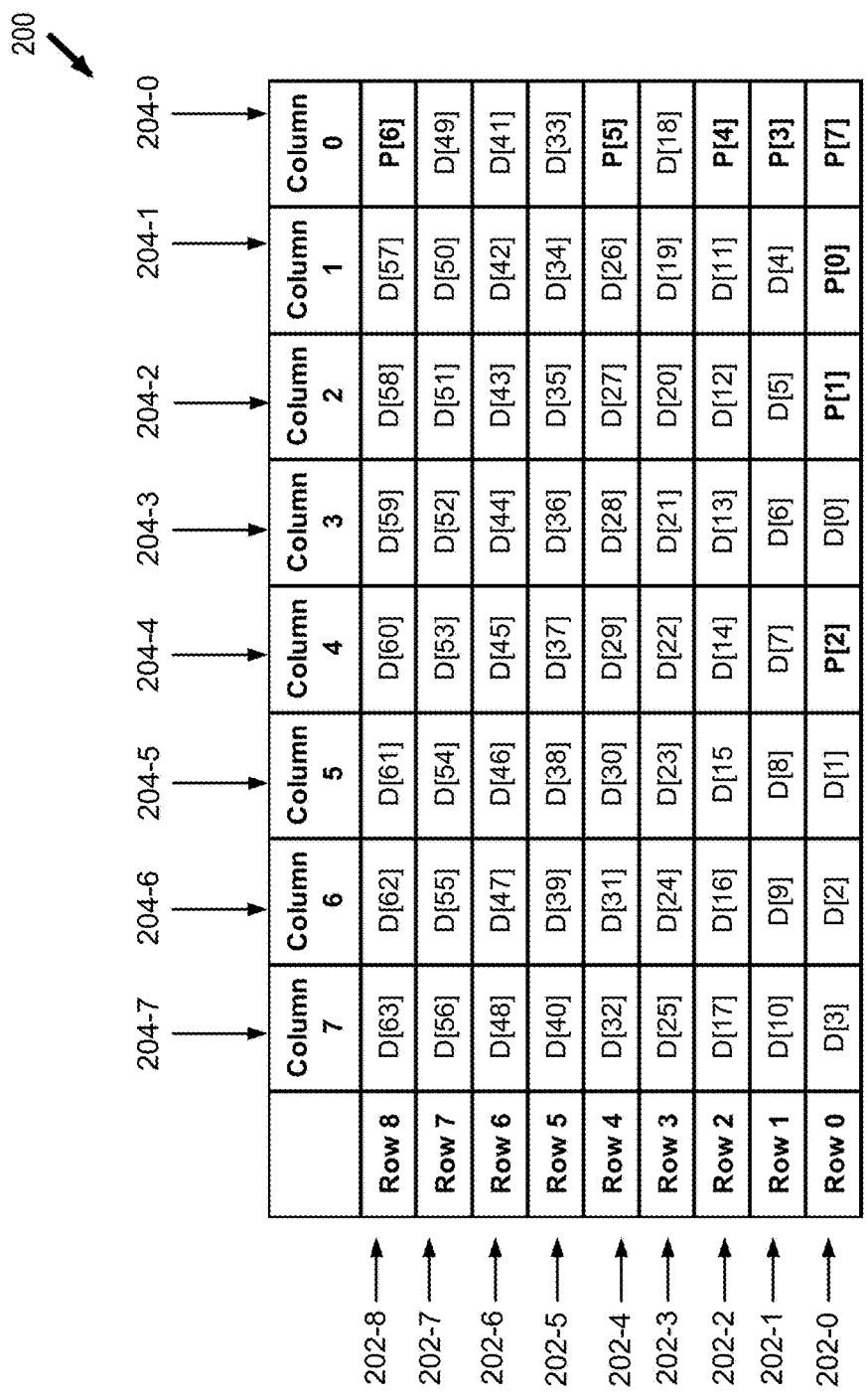
FIG. 2B  (72, 64) Hamming Code

| | Column 7 | Column 6 | Column 5 | Column 4 | Column 3 | Column 2 | Column 1 | Column 0 |
|---|---|---|---|---|---|---|---|---|
| Row 17 | | | | | | | | 136 |
| Row 16 | 135 | 134 | 133 | 132 | 131 | 130 | 129 | 128 |
| Row 15 | 127 | 126 | 125 | 124 | 123 | 122 | 121 | 120 |
| Row 14 | 119 | 118 | 117 | 116 | 115 | 114 | 113 | 112 |
| Row 13 | 111 | 110 | 109 | 108 | 107 | 106 | 105 | 104 |
| Row 12 | 103 | 102 | 101 | 100 | 99 | 98 | 97 | 96 |
| Row 11 | 95 | 94 | 93 | 92 | 91 | 90 | 89 | 88 |
| Row 10 | 87 | 86 | 85 | 84 | 83 | 82 | 81 | 80 |
| Row 9 | 79 | 78 | 77 | 76 | 75 | 74 | 73 | 72 |
| Row 8 | 71 | 70 | 69 | 68 | 67 | 66 | 65 | 64 |
| Row 7 | 63 | 62 | 61 | 60 | 59 | 58 | 57 | 56 |
| Row 6 | 55 | 54 | 53 | 52 | 51 | 50 | 49 | 48 |
| Row 5 | 47 | 46 | 45 | 44 | 43 | 42 | 41 | 40 |
| Row 4 | 39 | 38 | 37 | 36 | 35 | 34 | 33 | 32 |
| Row 3 | 31 | 30 | 29 | 28 | 27 | 26 | 25 | 24 |
| Row 2 | 23 | 22 | 21 | 20 | 19 | 18 | 17 | 16 |
| Row 1 | 15 | 14 | 13 | 12 | 11 | 10 | 9 | 8 |
| Row 0 | 7 | 6 | 5 | 4 | 3 | 2 | 1 | 0 |

250

P[7] → 128, P[6] → 64, P[5] → 32, P[4] → 16, P[3] → 8
P[8] → 0, P[0] → 1, P[1] → 2, P[2] → 4

(137, 128) Hamming Code

FIG. 2C (266, 256) Hamming Code

| | Column 0 | Column 1 | Column 2 | Column 3 | Column 4 | Column 5 | Column 6 | Column 7 |
|---|---|---|---|---|---|---|---|---|
| Row 33 | 264 | 265 | 266 | | | | | |
| Row 32 | 256 | 257 | 258 | 259 | 260 | 261 | 262 | 263 |
| Row 31 | 248 | 249 | 250 | 251 | 252 | 253 | 254 | 255 |
| Row 30 | 240 | 241 | 242 | 243 | 244 | 245 | 246 | 247 |
| Row 29 | 232 | 233 | 234 | 235 | 236 | 237 | 238 | 239 |
| Row 28 | 224 | 225 | 226 | 227 | 228 | 229 | 230 | 231 |
| Row 27 | 216 | 217 | 218 | 219 | 220 | 221 | 222 | 223 |
| Row 26 | 208 | 209 | 210 | 211 | 212 | 213 | 214 | 215 |
| Row 25 | 200 | 201 | 202 | 203 | 204 | 205 | 206 | 207 |
| Row 24 | 192 | 193 | 194 | 195 | 196 | 197 | 198 | 199 |
| Row 23 | 184 | 185 | 186 | 187 | 188 | 189 | 190 | 191 |
| Row 22 | 176 | 177 | 178 | 179 | 180 | 181 | 182 | 183 |
| Row 21 | 168 | 169 | 170 | 171 | 172 | 173 | 174 | 175 |
| Row 20 | 160 | 161 | 162 | 163 | 164 | 165 | 166 | 167 |
| Row 19 | 152 | 153 | 154 | 155 | 156 | 157 | 158 | 159 |
| Row 18 | 144 | 145 | 146 | 147 | 148 | 149 | 150 | 151 |
| Row 17 | 136 | 137 | 138 | 139 | 140 | 141 | 142 | 143 |
| Row 16 | 128 | 129 | 130 | 131 | 132 | 133 | 134 | 135 |
| Row 15 | 120 | 121 | 122 | 123 | 124 | 125 | 126 | 127 |
| Row 14 | 112 | 113 | 114 | 115 | 116 | 117 | 118 | 119 |
| Row 13 | 104 | 105 | 106 | 107 | 108 | 109 | 110 | 111 |
| Row 12 | 96 | 97 | 98 | 99 | 100 | 101 | 102 | 103 |
| Row 11 | 88 | 89 | 90 | 91 | 92 | 93 | 94 | 95 |
| Row 10 | 80 | 81 | 82 | 83 | 84 | 85 | 86 | 87 |
| Row 9 | 72 | 73 | 74 | 75 | 76 | 77 | 78 | 79 |
| Row 8 | 64 | 65 | 66 | 67 | 68 | 69 | 70 | 71 |
| Row 7 | 56 | 57 | 58 | 59 | 60 | 61 | 62 | 63 |
| Row 6 | 48 | 49 | 50 | 51 | 52 | 53 | 54 | 55 |
| Row 5 | 40 | 41 | 42 | 43 | 44 | 45 | 46 | 47 |
| Row 4 | 32 | 33 | 34 | 35 | 36 | 37 | 38 | 39 |
| Row 3 | 24 | 25 | 26 | 27 | 28 | 29 | 30 | 31 |
| Row 2 | 16 | 17 | 18 | 19 | 20 | 21 | 22 | 23 |
| Row 1 | 8 | 9 | 10 | 11 | 12 | 13 | 14 | 15 |
| Row 0 | 0 | 1 | 2 | 3 | 4 | 5 | 6 | 7 |

|  | Column 7 | Column 6 | Column 5 | Column 4 | Column 3 | Column 2 | Column 1 | Column 0 |
|---|---|---|---|---|---|---|---|---|
| Row 8 | b1[15] | b0[15] | b1[13] | b0[13] | b1[11] | b0[11] | b1[9] | P[6] |
| Row 7 | b0[9] | b1[7] | b0[7] | b1[5] | b0[5] | b1[3] | b0[3] | b1[1] |
| Row 6 | b0[11] | b1[14] | b0[14] | b1[12] | b0[12] | b1[10] | b0[10] | b1[8] |
| Row 5 | b0[8] | b1[6] | b0[6] | b1[4] | b0[4] | b1[2] | b0[2] | b1[0] |
| Row 4 | b0[0] | a1[15] | a0[15] | a1[13] | a0[13] | a1[11] | a0[11] | P[5] |
| Row 3 | a1[9] | a0[9] | a1[7] | a0[7] | a1[5] | a0[5] | a1[3] | a0[3] |
| Row 2 | a1[1] | a0[1] | a1[14] | a0[14] | a1[12] | a0[12] | a1[10] | P[4] |
| Row 1 | a0[10] | a1[8] | a0[8] | a1[6] | a0[6] | a1[4] | a0[4] | P[3] |
| Row 0 | a1[2] | a0[2] | a1[0] | a0[0] | P[2] | P[1] | P[0] | P[7] |

|  | Column 0 | Column 1 | Column 2 | Column 3 | Column 4 | Column 5 | Column 6 | Column 7 |
|---|---|---|---|---|---|---|---|---|
| Row 8 | P2[6] | D2[57] | D2[58] | D2[59] | D2[60] | D2[61] | D2[62] | D2[63] |
| Row 7 | D2[49] | D2[50] | D2[51] | D2[52] | D2[53] | D2[54] | D2[55] | D2[56] |
| Row 6 | D2[41] | D2[42] | D2[43] | D2[44] | D2[45] | D2[46] | D2[47] | D2[48] |
| Row 5 | D2[33] | D2[34] | D2[35] | D2[36] | D2[37] | D2[38] | D2[39] | D2[40] |
| Row 4 | P2[5] | D2[26] | D2[27] | D2[28] | D2[29] | D2[30] | D2[31] | D2[32] |
| Row 3 | D2[18] | D2[19] | D2[20] | D2[21] | D2[22] | D2[23] | D2[24] | D2[25] |
| Row 2 | P2[4] | D2[11] | D2[12] | D2[13] | D2[14] | D2[15] | D2[16] | D2[17] |
| Row 1 | P2[3] | D2[4] | D2[5] | D2[6] | D2[7] | D2[8] | D2[9] | D2[10] |
| Row 0 | P2[7] | P2[0] | P2[1] | D2[0] | P2[2] | D2[1] | D2[2] | D2[3] |

| | Column 0 | Column 1 | Column 2 | Column 3 | Column 4 | Column 5 | Column 6 | Column 7 | |
|---|---|---|---|---|---|---|---|---|---|
| Row 8 | P2[6] | D2[57] | D2[58] | D2[59] | D2[60] | D2[61] | D2[62] | D2[63] | sr8 |
| Row 7 | D2[49] | D2[50] | D2[51] | D2[52] | D2[53] | D2[54] | D2[55] | D2[56] | sr7 |
| Row 6 | D2[41] | D2[42] | D2[43] | D2[44] | D2[45] | D2[46] | D2[47] | D2[48] | sr6 |
| Row 5 | D2[33] | D2[34] | D2[35] | D2[36] | D2[37] | D2[38] | D2[39] | D2[40] | sr5 |
| Row 4 | P2[5] | D2[26] | D2[27] | D2[28] | D2[29] | D2[30] | D2[31] | D2[32] | sr4 |
| Row 3 | D2[18] | D2[19] | D2[20] | D2[21] | D2[22] | D2[23] | D2[24] | D2[25] | sr3 |
| Row 2 | P2[4] | D2[11] | D2[12] | D2[13] | D2[14] | D2[15] | D2[16] | D2[17] | sr2 |
| Row 1 | P2[3] | D2[4] | D2[5] | D2[6] | D2[7] | D2[8] | D2[9] | D2[10] | sr1 |
| Row 0 | P2[7] | P2[0] | P2[1] | D2[0] | P2[2] | D2[1] | D2[2] | D2[3] | sr0 |

| | Column 0 | Column 1 | Column 2 | Column 3 | Column 4 | Column 5 | Column 6 | Column 7 |
|---|---|---|---|---|---|---|---|---|
| Row 8 | P2[6] | D2[57] | D2[58] | D2[59] | D2[60] | D2[61] | D2[62] | D2[63] |
| Row 7 | D2[49] | D2[50] | D2[51] | D2[52] | D2[53] | D2[54] | D2[55] | D2[56] |
| Row 6 | D2[41] | D2[42] | D2[43] | D2[44] | D2[45] | D2[46] | D2[47] | D2[48] |
| Row 5 | D2[33] | D2[34] | D2[35] | D2[36] | D2[37] | D2[38] | D2[39] | D2[40] |
| Row 4 | P2[5] | D2[26] | D2[27] | D2[28] | D2[29] | D2[30] | D2[31] | D2[32] |
| Row 3 | D2[18] | D2[19] | D2[20] | D2[21] | D2[22] | D2[23] | D2[24] | D2[25] |
| Row 2 | P2[4] | D2[11] | D2[12] | D2[13] | D2[14] | D2[15] | D2[16] | D2[17] |
| Row 1 | P2[3] | D2[4] | D2[5] | D2[6] | D2[7] | D2[8] | D2[9] | D2[10] |
| Row 0 | P2[7] | P2[0] | P2[1] | D2[0] | P2[2] | D2[1] | D2[2] | D2[3] |

$S[3] = sr1 \wedge sr3 \wedge sr5 \wedge sr7$

FIG. 15D

| | Column 0 | Column 1 | Column 2 | Column 3 | Column 4 | Column 5 | Column 6 | Column 7 |
|---|---|---|---|---|---|---|---|---|
| Row 8 | P2[6] | D2[57] | D2[58] | D2[59] | D2[60] | D2[61] | D2[62] | D2[63] |
| Row 7 | D2[49] | D2[50] | D2[51] | D2[52] | D2[53] | D2[54] | D2[55] | D2[56] |
| Row 6 | D2[41] | D2[42] | D2[43] | D2[44] | D2[45] | D2[46] | D2[47] | D2[48] |
| Row 5 | D2[33] | D2[34] | D2[35] | D2[36] | D2[37] | D2[38] | D2[39] | D2[40] |
| Row 4 | P2[5] | D2[26] | D2[27] | D2[28] | D2[29] | D2[30] | D2[31] | D2[32] |
| Row 3 | D2[18] | D2[19] | D2[20] | D2[21] | D2[22] | D2[23] | D2[24] | D2[25] |
| Row 2 | P2[4] | D2[11] | D2[12] | D2[13] | D2[14] | D2[15] | D2[16] | D2[17] |
| Row 1 | P2[3] | D2[4] | D2[5] | D2[6] | D2[7] | D2[8] | D2[9] | D2[10] |
| Row 0 | P2[7] | P2[0] | P2[1] | D2[0] | P2[2] | D2[1] | D2[2] | D2[3] |

$S[5] = sr4 \wedge sr5 \wedge sr6 \wedge sr7$

FIG. 15F

|  | Column 0 | Column 1 | Column 2 | Column 3 | Column 4 | Column 5 | Column 6 | Column 7 |
|---|---|---|---|---|---|---|---|---|
| Row 8 | P2[6] | D2[57] | D2[58] | D2[59] | D2[60] | D2[61] | D2[62] | D2[63] |
| Row 7 | D2[49] | D2[50] | D2[51] | D2[52] | D2[53] | D2[54] | D2[55] | D2[56] |
| Row 6 | D2[41] | D2[42] | D2[43] | D2[44] | D2[45] | D2[46] | D2[47] | D2[48] |
| Row 5 | D2[33] | D2[34] | D2[35] | D2[36] | D2[37] | D2[38] | D2[39] | D2[40] |
| Row 4 | D2[25] | D2[26] | D2[27] | D2[28] | D2[29] | D2[30] | D2[31] | D2[32] |
| Row 3 | D2[18] | D2[19] | D2[20] | D2[21] | D2[22] | D2[23] | D2[24] | D2[25] |
| Row 2 | P2[5] | D2[11] | D2[12] | D2[13] | D2[14] | D2[15] | D2[16] | D2[17] |
| Row 1 | D2[3] | P2[0] | P2[1] | D2[6] | P2[2] | D2[8] | D2[9] | D2[10] |
| Row 0 | P2[7] | P2[0] | P2[1] | D2[0] | P2[2] | D2[1] | D2[2] | D2[3] |

FIG. 15G

| Term | XOR Gate | Term | XOR Gate | Term | XOR Gate |
|---|---|---|---|---|---|
| pr1 | 6 | pc1 | 7 | P1[0] | 3 |
| pr2 | 6 | pc2 | 7 | P1[1] | 3 |
| pr3 | 7 | pc3 | 8 | P1[2] | 3 |
| pr4 | 6 | pc4 | 7 | P1[3] | 3 |
| pr5 | 7 | pc5 | 8 | P1[4] | 3 |
| pr6 | 7 | pc6 | 8 | P1[5] | 3 |
| pr7 | 7 | pc7 | 8 | P1[6] | 0 |
| pr8 | 6 |   |   | P1[7] | 17 |
| Total Number of XOR Gates: 140 | | | | | |

FIG. 16A

| Term | XOR Gate | Term | XOR Gate | Term | XOR Gate |
|---|---|---|---|---|---|
| sr1 | 7 | sc1 | 8 | S[0] | 3 |
| sr2 | 7 | sc2 | 8 | S[1] | 3 |
| sr3 | 7 | sc3 | 8 | S[2] | 3 |
| sr4 | 7 | sc4 | 8 | S[3] | 3 |
| sr5 | 7 | sc5 | 8 | S[4] | 3 |
| sr6 | 7 | sc6 | 8 | S[5] | 3 |
| sr7 | 7 | sc7 | 8 | S[6] | 0 |
| sr8 | 7 | | | S[7] | 11 |

Total Number of XOR Gates: 138

FIG. 16B

METHOD AND APPARATUS FOR ERROR DETECTION AND CORRECTION

TECHNICAL FIELD

Examples of the present disclosure generally relate to integrated circuits ("ICs") and, in particular, to an embodiment related to error detection and correction and more particularly to detecting and correcting errors in a memory.

BACKGROUND

The capability to store data in memory devices improves with advances in technology. However, wear of a memory element of a memory may occur due to writes, reads, erases, and other memory operations to the memory element. When a memory element experiences excessive wear, it may cease to be a reliable storage element.

Error detection and correction may be applied using error correction codes (ECC) to stored data and may detect and/or correct errors that have corrupted the stored data. Error detection and correction consumes time and computing resources. Reducing error correction computing time would result in greater computing efficiency.

Accordingly, it would be desirable and useful to provide an area efficient ECC with improved performance and resource utilization.

SUMMARY

In some embodiments in accordance with the present disclosure, an integrated circuit (IC) includes an encoder configured to receive input data including a plurality of data bits. The encoder includes a parity computation matrix circuit configured to arrange the data bits according to a matrix format to generate a parity computation matrix. The encoder further includes a parity computation circuit configured to compute a plurality of parity computation row terms corresponding to rows of the parity computation matrix respectively; compute a plurality of parity computation column terms corresponding to columns of the parity computation matrix respectively; compute parity bits using the parity computation row terms and parity computation column terms; and provide write data including the data bits and the parity bits to a write circuit, wherein the write circuit writes the write data to a memory cell array in a memory.

In some embodiments, the matrix format is configured based on a first total number of the parity bits and a second total number of the data bits, such that the data bits and parity bits are arranged in the matrix format in a symmetric manner.

In some embodiments, the parity bits include a first number of local column parity bits; a second number of local row parity bits; and an overall parity bit. The matrix format is configured so that the local column parity bits are located in a parity bit row of the matrix format, and the local row parity bits are located in a parity bit row of the parity computation matrix.

In some embodiments, the first number of local column parity bits are generated using the plurality of parity computation column terms. The second number of local row parity bits are generated using the plurality of parity computation row terms. The overall parity bit is generated using the local column parity bits, the local row parity bits, and the plurality of parity computation column terms.

In some embodiments, the write data is a Hamming code.

In some embodiments, a difference between the first number and the second number is equal to or less than one.

In some embodiments, an $i^{th}$ local column parity bit of the first number of local column parity bits is generated using parity computation column terms corresponding to every other $2^i$ column(s) of the parity computation matrix; and a $j^{th}$ local row parity bit of the second number of local row parity bits is computed using parity computation row terms corresponding to every other $2^j$ row(s) of the parity computation matrix.

In some embodiments, the IC includes a decoder configured to receive read data that are read from the memory cell array of the memory. The decoder includes a syndrome computation matrix circuit configured to arrange data bits and parity bits of the read data according to the matrix format to generate a syndrome computation matrix. The decoder further includes a syndrome computation circuit configured to generate a plurality of syndrome computation row terms corresponding to rows of the syndrome computation matrix respectively; generate a plurality of syndrome computation column terms corresponding to columns of the syndrome computation matrix respectively; and generate syndrome bits using the syndrome computation row terms and syndrome computation column terms. The decoder further includes an error detection and correction circuit configured to decode the read data to generate decoded read data according to the syndrome bits.

In some embodiments, the syndrome computation circuit is configured to generate a third number of local column syndrome bits using the plurality of syndrome computation column terms; generate a fourth number of local row syndrome bits using the plurality of syndrome computation row terms; and generate an overall syndrome bit using the plurality of syndrome computation column terms.

In some embodiments, the error detection and correction circuit is configured to detect a single bit error in read data and in response, correcting the single bit error using the syndrome bits.

In some embodiments in accordance with the present disclosure, a method includes receiving input data including a plurality of data bits; arranging the data bits according to a matrix format to generate a parity computation matrix; computing a plurality of parity computation row terms corresponding to rows of the parity computation matrix respectively; computing a plurality of parity computation column terms corresponding to columns of the parity computation matrix respectively; computing parity bits using the parity computation row terms and parity computation column terms; and providing write data including the data bits and the parity bits to a write circuit, wherein the write circuit writes the write data to a memory cell array in a memory.

In some embodiments, the method includes receiving read data that are read from the memory cell array of the memory; arranging data bits and parity bits of the read data according to the matrix format to generate a syndrome computation matrix; generating a plurality of syndrome computation row terms corresponding to rows of the syndrome computation matrix respectively; generating a plurality of syndrome computation column terms corresponding to columns of the syndrome computation matrix respectively; generating syndrome bits using the syndrome computation row terms and syndrome computation column terms; and decoding the read data to generate decoded read data according to the syndrome bits.

In some embodiments, the method includes generating a third number of local column syndrome bits using the plurality of syndrome computation column terms; generating a fourth number of local row syndrome bits using the plurality of syndrome computation row terms; and generating an overall syndrome bit using the plurality of syndrome computation column terms.

In some embodiments, the method includes detecting a single bit error in read data and in response, correcting the single bit error using the syndrome bits.

Other aspects and features will be evident from reading the following detailed description and accompanying drawings.

BRIEF DESCRIPTION OF THE DRAWINGS

FIG. 2B is a block diagram illustrating an exemplary matrix format indicating bits locations according to some embodiments of the present disclosure.

FIG. 2C is a block diagram illustrating an exemplary matrix format indicating bit positions according to some embodiments of the present disclosure.

FIG. 2D is a block diagram illustrating an exemplary matrix format indicating bit positions according to some embodiments of the present disclosure.

FIG. 5 is a block diagram illustrating an exemplary matrix format indicating data bits and parity bits locations according to some embodiments of the present disclosure.

FIG. 9A is a listing diagram listing exemplary parity computation row terms computation equations according to some embodiments of the present disclosure.

FIG. 9B is a listing diagram listing exemplary parity computation column terms computation equations according to some embodiments of the present disclosure.

FIGS. 10A, 10B, 10C, 10D, 10E, 10F, 10G, and 10H are block diagrams illustrating exemplary parity computation matrices for computing parity bits according to some embodiments of the present disclosure.

FIG. 13 is a block diagram illustrating a syndrome computation matrix according to some embodiments of the present disclosure.

FIG. 14A is a listing diagram listing exemplary syndrome computation row terms computation equations according to some embodiments of the present disclosure.

FIG. 14B is a listing diagram listing exemplary syndrome computation column terms computation equations according to some embodiments of the present disclosure.

FIGS. 15A, 15B, 15C, 15D, 15E, 15F, 15G, and 15H are block diagrams illustrating exemplary syndrome computation matrices for computing syndrome bits according to some embodiments of the present disclosure.

FIG. 16A is a table diagram illustrating an exemplary usage of XOR gates in parity bits computation.

FIG. 16B is a table diagram illustrating an exemplary usage of XOR gates in syndrome bits computation.

DETAILED DESCRIPTION

Figure 1:
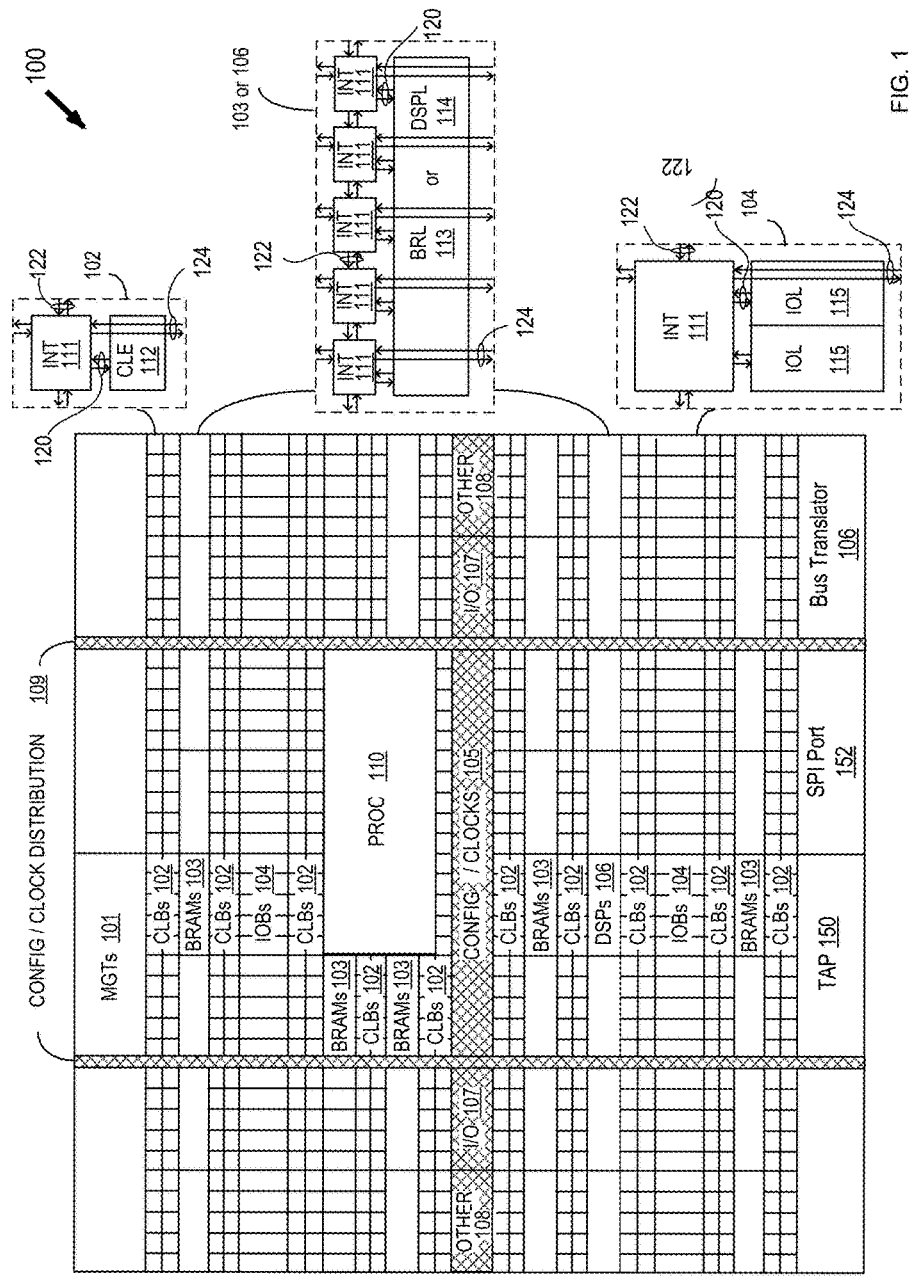
FIG. 1 is a block diagram illustrating an exemplary architecture for an IC according to some embodiments of the present disclosure.

Various embodiments are described hereinafter with reference to the figures, in which exemplary embodiments are shown. The claimed invention may, however, be embodied in different forms and should not be construed as being limited to the embodiments set forth herein. Like reference numerals refer to like elements throughout. Like elements will, thus, not be described in detail with respect to the description of each figure. It should also be noted that the figures are only intended to facilitate the description of the embodiments. They are not intended as an exhaustive description of the claimed invention or as a limitation on the scope of the claimed invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described. The features, functions, and advantages may be achieved independently in various embodiments or may be combined in yet other embodiments.

Before describing exemplary embodiments illustratively depicted in the several figures, a general introduction is provided to further understanding. An error correction code (ECC) in a memory may add parity bits (check bits, protection bits) to each word stored in a memory array of the memory. During a write operation to the memory, parity bits are generated and stored along with the data bits of the word. When a Hamming code is used, during a read operation, these parity bits may be used to detect and correct any single bit error, or to detect (but not correct) any double bit error. In some embodiments, an ECC for a memory having a larger word width (e.g., a sixty-four-bit wide memory) may use a nested ECC designed for a memory having a smaller word width (e.g., a sixteen-bit wide memory). In such embodiments, swizzle logic units may be used to align data positions for the ECC and the nested ECC. For integrated circuit (IC) solutions, it has been discovered that in the Hamming code representation of the ECC, by using a matrix format that is designed based on the particular word width of the memory, the swizzle logic units in the ECC may be eliminated. Also, the computation required during the encoding and decoding processes may be optimized by arranging the data bits and parity bits in the matrix format in a symmetric manner.

Because one or more of the above-described embodiments are exemplified using a particular type of IC, a detailed description of such an IC is provided below. However, it should be understood that other types of ICs may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device (CPLD). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

In general, each of these programmable logic devices ("PLDs"), the functionality of the device is controlled by configuration data provided to the device for that purpose. The configuration data can be stored in volatile memory (e.g., static memory cells, as common in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an exemplary FPGA architecture 100. The FPGA architecture 100 includes a large number of different programmable tiles, including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile can include at least one programmable interconnect element ("INT") 111 having connections to input and output terminals 120 of a programmable logic element within the same tile, as shown by examples included at the top of FIG. 1. Each programmable interconnect element 111 can also include connections to interconnect segments 122 of adjacent programmable interconnect element(s) in the same tile or other tile(s). Each programmable interconnect element 111 can also include connections to interconnect segments 124 of general routing resources between logic blocks (not shown). The general routing resources can include routing channels between logic blocks (not shown) comprising tracks of interconnect segments (e.g., interconnect segments 124) and switch blocks (not shown) for connecting interconnect segments. The interconnect segments of the general routing resources (e.g., interconnect segments 124) can span one or more logic blocks. The programmable interconnect elements 111 taken together with the general routing resources implement a programmable interconnect structure ("programmable interconnect") for the illustrated FPGA.

In an example implementation, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the example of FIG. 1, an area (depicted horizontally) near the center of the die (e.g., formed of regions 105, 107, and 108 shown in FIG. 1) can be used for configuration, clock, and other control logic. Column 109 (depicted vertically) extending from this horizontal area or other columns may be used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, PROC 110 spans several columns of CLBs and BRAMs. PROC 110 can include various components ranging from a single microprocessor to a complete programmable processing system of microprocessor(s), memory controllers, peripherals, and the like.

In one aspect, PROC 110 is implemented as a dedicated circuitry, e.g., as a hard-wired processor, that is fabricated as part of the die that implements the programmable circuitry of the IC. PROC 110 can represent any of a variety of different processor types and/or systems ranging in complexity from an individual processor, e.g., a single core capable of executing program code, to an entire processor system having one or more cores, modules, co-processors, interfaces, or the like.

In another aspect, PROC 110 is omitted from architecture 100, and may be replaced with one or more of the other varieties of the programmable blocks described. Further, such blocks can be utilized to form a "soft processor" in that the various blocks of programmable circuitry can be used to form a processor that can execute program code, as is the case with PROC 110.

The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 1 that are external to PROC 110 such as CLBs 102 and BRAMs 103 can be considered programmable circuitry of the IC.

In some embodiments, the functionality and connectivity of programmable circuitry are not established until configuration data is loaded into the IC. A set of configuration data can be used to program programmable circuitry of an IC such as an FPGA. The configuration data is, in some cases, referred to as a "configuration bitstream." In general, programmable circuitry is not operational or functional without first loading a configuration bitstream into the IC. The configuration bitstream effectively implements or instantiates a particular circuit design within the programmable circuitry. The circuit design specifies, for example, functional aspects of the programmable circuit blocks and physical connectivity among the various programmable circuit blocks.

In some embodiments, circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 110.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable and has a particular function when manufactured as part of the IC.

FIG. 1 is intended to illustrate an exemplary architecture that can be used to implement an IC that includes programmable circuitry, e.g., a programmable fabric. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual IC, more than one adjacent row of CLBs is typically included wherever the CLBs appear, to facilitate the efficient implementation of user logic, but the number of adjacent CLB rows varies with the overall size of the IC. Moreover, the FPGA of FIG. 1 illustrates one example of a programmable IC that can employ examples of the interconnect circuits described herein. The interconnect circuits described herein can be used in other types of programmable ICs, such as CPLDs or any type of programmable IC having a programmable interconnect structure for selectively coupling logic elements.

It is noted that the IC that may implement the error detection and correction is not limited to the exemplary IC depicted in FIG. 1, and that IC having other configurations, or other types of IC, may also implement the error detection and correction.

Figure 2A:
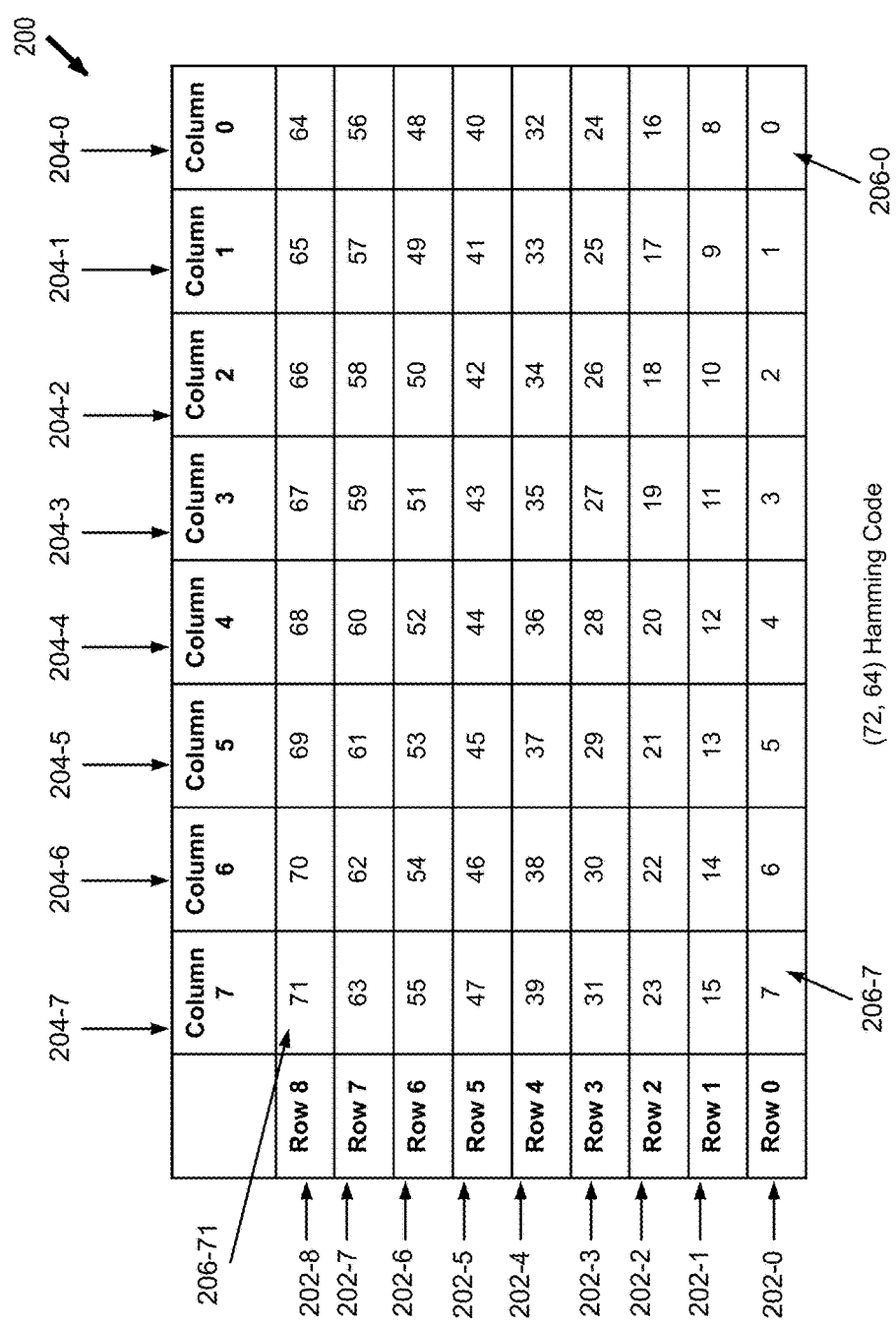
FIG. 2A is a block diagram illustrating an exemplary matrix format indicating bit positions according to some embodiments of the present disclosure.

Referring to FIGS. 2A, 2B, 2C, and 2D, in some embodiments, an error correction code (ECC) for a storage unit (e.g., a memory) may be implemented using a Hamming code. In such embodiments, data bits and parity bits of the Hamming code may be arranged according to a matrix format (also referred to as an H-Matrix) for parity bit and syndrome bit computation. In the illustrated example of FIGS. 2A and 2B, the Hamming code has a total of seventy-two bits including sixty-four data bits D[63:0] and eight parity bits P[7:0]. Such a Hamming code may be denoted as a (72,64) Hamming code. The seventy-two bits may be arranged according to a matrix format 200 (also referred to as an H-Matrix 200) such that the data bits and parity bits are located in a symmetric manner. Referring to FIG. 2A, a matrix format 200 includes rows 202-0 through 202-8 and columns 204-0 through 204-7. As shown in the example of FIG. 2A, each bit of the seventy-two bits may be arranged in the seventy-two matrix cells 206-0 through 206-71 respectively, where the $i^{th}$ bit in the seventy-two bits is located in a corresponding matrix cell 206-$i$. The zeroth bit of the seventy-two bits is located in a matrix cell 206-0 at the zeroth row 202-0 and zeroth column 204-0, while the seventy-first bit of the seventy-two bits is located in a matrix cell 206-71 at the eighth row 202-8 and seventh column 204-7.

Referring to FIG. 2B, illustrated is the arrangement of the data bits D[63:0] and parity bits P[7:0] of the (72, 64) Hamming code in the matrix format 200. In some embodiments, each of the parity bits P[6:0] may be computed using a subset of the data bits D[63:0], and is also referred to as a local parity bit. The parity bit P[7] may be computed using both the local parity bits P[6:0] and the data bits D[63:0], and is also referred to as an overall parity bit P[7] or a global parity bit P[7]. A local parity bit P[i] is located at the $(2^i)^{th}$ bit location. As such, local parity bits P[0], P[1], P[2], P[3], P[4], P[5], and P[6] are located in matrix cells 206-1, 206-2, 206-4, 206-8, 206-16, 206-32, and 206-64 respectively. The overall parity bit P[7] may be located in the matrix cell 206-0. The data bits D[63:0] are located in the other matrix cells. The data bits D[63:0] and parity bits P[7:0] may occupy all the matrix cells in the matrix format 200.

In some embodiments, the matrix format 200 is configured such that data bits and parity bits of the Hamming code are arranged in a symmetric manner. The number of columns of the matrix format 200 may be determined based on the number of local parity bits to achieve such a symmetric manner. In some embodiments, as illustrated in FIGS. 2A and 2B, the Hamming code (e.g., the (72, 64) Hamming code) includes an odd number (e.g., 7) of local parity bits. By using a configuration of a matrix format 200 having eight columns and nine rows, the (72, 64) Hamming code, three local parity bits P[2:0] are located in the same row (e.g., the zeroth row 202-0) of the matrix format 200. That row may be referred to as a parity bit row. Those local parity bits P[2:0] may also be referred to as local column parity bits P[2:0]. Four local parity bits P[6:3] are located in the same column (e.g., the zeroth column 204-0) of the matrix format. That column may be referred to as a parity bit column, and the local parity bits P[6:3] may also be referred to as local row parity bits P[6:3]. In such embodiments, the matrix format 200 is configured to have a column number (e.g., 8) such that the difference between the number (e.g., 3) of local column parity bits located in the same row and the number (e.g., 4) of local row parity bits located in the same column is equal to one.

In some embodiments, the Hamming code includes an even number (e.g., 2, 4) of local parity bits. In such embodiments, the matrix format 200 may be configured to have a particular number of columns, such that the number of local parity bits located in the same row (e.g., the zeroth row) is the same as the number of local parity bits located in the same column (e.g., the zeroth column). In other words, the number of local row parity bits may be the same as the number of local column parity bits. In an example, where the Hamming code includes two local parity bits, the matrix format 200 may have two columns. In another example where the Hamming code includes four local parity bits, the matrix format may have four columns.

Referring to FIGS. 2C and 2D, in some embodiments, the matrix format for a Hamming code may be configured such that data bits and parity bits are arranged in a symmetric manner, while the difference between the number of local column parity bits and the number of local row parity bits is greater than one. Illustrated in FIG. 2C is an exemplary matrix format 250 for a (137, 128) Hamming code, where the matrix format 250 includes eight columns and eighteen rows. Three local column parity bits P[0], P[1], and P[2] are located in the zeroth row of the matrix format 250 corresponding to bit positions 1, 2, and 4 respectively. Five local row parity bits P[3], P[4], P[5], P[6], and P[7] are located in the zeroth column of the matrix 250 corresponding to bit positions 8, 16, 32, 64, and 128 respectively. The global parity bit P[8] is located at bit position 0. Data bits D[127:0] are arranged in the other matrix cells of the matrix format 250 following the order of the bit positions substantially similar to the data bits arrangement in the matrix format 200 as described above with reference to FIG. 2B. Similarly, illustrated in FIG. 2D is an exemplary matrix format 260 for a (266, 256) Hamming code, where the matrix format 260 includes eight columns and thirty-four rows. Three local column parity bits P[0], P[1], and P[2] are located in the zeroth row of the matrix format 260 corresponding to bit positions 1, 2, and 4 respectively. Six local row parity bits P[3], P[4], P[5], P[6], P[7] are located in the zeroth column of the matrix 260 corresponding to bit positions 8, 16, 32, 64, 128, and 256 respectively. Data bits D[255:0] are arranged in the other matrix cells of the matrix format 260 following the order of the bit positions substantially similar to the data bits arrangement in the matrix format 200 as described above with reference to FIG. 2B.

Figure 3:
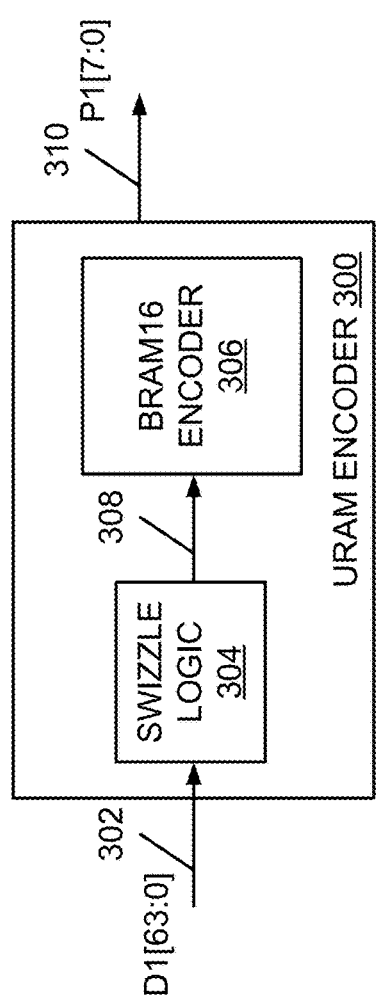
FIG. 3 is a block diagram illustrating an exemplary embodiment of an encoder according to some embodiments of the present disclosure.
Figure 4:
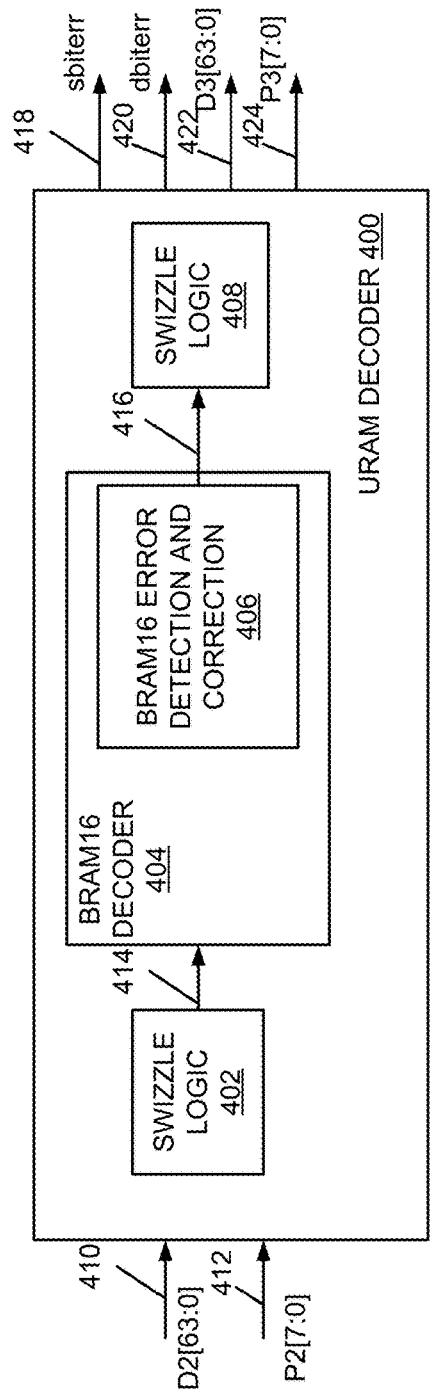
FIG. 4 is a block diagram illustrating an exemplary embodiment of a decoder according to some embodiments of the present disclosure.

Referring to FIGS. 3, 4, and 5, in some embodiments, an ECC for a memory of a particular width (e.g., sixty-four bits) may use a nested ECC implemented for a memory having a smaller width (e.g., sixteen bits). In such embodiments, the nested ECC may use a matrix format specifically designed for a sixteen-bit wide memory, which may be different from a matrix format (e.g., a matrix format 200 of FIGS. 2A and 2B) designed for a sixty-four-bit wide memory. As such, swizzle logic units may be used in the ECC to align the data bits and parity bits with the nested ECC.

In the illustrated examples of FIGS. 3 and 4, an ECC for a sixty-four-bit wide block random access memory (RAM) is illustrated. Such a sixty-four-bit wide block RAM also referred to as BRAM64 or Ultra RAM (URAM), and the ECC may be referred to as a URAM ECC. The URAM ECC is implemented using a nested ECC designed for a sixteen-bit wide BRAM, referred to as BRAM16. FIG. 3 illustrates a URAM encoder 300 implemented with a nested BRAM16 encoder 306 designed for the BRAM16. FIG. 4 illustrates a URAM decoder 400 implemented with a nested BRAM16 decoder 404 designed for the BRAM16. Because of the different width, the BRAM16 and URAM may process sixty-four bit wide data differently. For example, during a write operation in a BRAM16, sixty-four-bit wide input data may be arranged into four sets each having sixteen bits according to a matrix format designed for the BRAM16 (e.g., a matrix format 500 of FIG. 5) for a BRAM16 encoder. The matrix format 500 is also referred to as a BRAM16 H-Matrix 500. In such an example, after encoding, each set may be written into a different memory array of the BRAM16 (e.g., after a 4:1 column multiplexing process). Similarly, during a read operation in BRAM16, sixty-four bit wide data may be read as four sets of data from four different memory arrays, which may then be arranged according to the matrix format 500 of FIG. 5 for a BRAM16 decoder. On the other hand, during a write operation in a URAM, sixty-four bit wide data may be written into a single memory array of the URAM. Similarly, during a read operation in URAM, sixty-four bit wide data may be read from a single memory array of the URAM. Accordingly, as described in detail below, swizzle logic circuits may be used in the URAM encoder 300 and URAM decoder 400 to realize the mapping between the URAM bit positions (e.g., as provided by the matrix format 200 of FIGS. 2A and 2B) and the BRAM16 bit positions (e.g., as provided by the matrix format 500 of FIG. 5).

Referring to FIG. 3, an exemplary URAM encoder 300 includes a swizzle logic circuit 304 configured to receive a signal 302 including input data D1[63:0]. The swizzle logic circuit 304 may align input data D1[63:0] with BRAM16 data bit positions (e.g., according to the matrix format 500 of FIG. 5) and output a signal 308 including the shuffled data bits to the BRAM16 encoder 306. The BRAM16 encoder 306 may compute parity bits P1[7:0] using the shuffled data bits provided in the signal, and outputs a signal 310 including the parity bits P1[7:0]. The unshuffled data bits D1[63:0] may then be written to a memory array in the URAM. Furthermore, the parity bits P1[7:0] may be written in a memory array in the URAM.

Referring to FIG. 4, an exemplary URAM decoder 400 includes a swizzle logic circuit 402 configured to receive data bits D2[63:0] at a signal 410 and parity bits P2[7:0] at a signal 412 that are read from the URAM. The swizzle logic circuit 402 may map the data bits D2[63:0] and parity bits P2[7:0] to BRAM16 bit positions (e.g., according to the matrix format 500 of FIG. 5), and provide a signal 414 including the shuffled data bits D2[63:0] and parity bits P2[7:0] to the BRAM16 decoder 404. The BRAM16 decoder 404 may decode the shuffled data bits D2[63:0] and parity bits P2[7:0], determine the syndrome bits, and send the syndrome bits to a BRAM16 error detection and correction unit 406 for performing error detection and correction. The BRAM16 error detection and correction unit 406 may generate error detection and correction information with reference to BRAM16 bit positions in a signal 416. A swizzle logic circuit 408 may receive the signal 416, map the error detection and correction information with reference to BRAM16 bit positions to the URAM bit positions, and outputs an error signal 418 indicating a single bit error (sbiterr) and an error signal 420 indicating a double bit error (dbiterr). In an example, both sbiterr and dbiterr having a value of zero may indicate that no error is detected. In another example, sbiterr having a value of one and dbiterr having a value of zero indicates that a single bit error is detected and corrected. In another example, sbiterr having a value of zero and dbiterr having a value of one indicates that a double bit error is detected. The swizzle logic circuit 408 may also output a signal 422 including data bits D3[63:0] including the corrected data bits arranged with reference to the URAM bit positions, and a signal 424 including the parity bits P3[7:0].

The URAM encoder 300 and the URAM decoder 400 and each of their blocks may be implemented in hardware, software, or a combination of hardware and software. The URAM encoder 300 and the URAM decoder 400 and each of their blocks may be implemented using a computer system with a processor and memory configured to execute software, or as an application specific integrated circuit, that are configured to perform the operations described herein. In some embodiments, the URAM encoder 300 and the URAM decoder 400 and each of their blocks may be implemented as a circuit within a field programmable gate array (FPGA), such as the FPGA described below with respect to FIG. 1.

For purposes of clarity and not limitation, in some embodiments, the URAM encoder 300 and the URAM decoder 400 and each of their blocks may be implemented using a computer system with a processor and memory configured to execute software, or as an application specific integrated circuit, that are configured to perform the operations described herein. The URAM encoder 300 and the URAM decoder 400 may alternatively be implemented as a circuit within a field programmable gate array (FPGA), such as the FPGA described below with respect to FIG. 1.

In various embodiments, the swizzle logic circuits in the URAM encoder and decoder may cause area overhead, add a delay penalty, and incur additional power usage. Furthermore, the capacitance on the inputs of the URAM encoder and decoder of FIGS. 3 and 4 may be high, which may affect the performance of the URAM ECC. Referring to FIGS. 2A, 2B, and 6 to 15H, in some embodiments, the swizzle logic circuits of FIGS. 3 and 4 may be eliminated in the URAM ECC by performing encoding and decoding based on the matrix format 200 of FIGS. 2A and 2B designed for the URAM, which is referred to as a URAM matrix format 200 hereinafter. As discussed in detail below, the URAM matrix format 200 arranges the data bits and parity bits in a symmetric matter, which enables the optimization of parity bit computations in encoding and syndrome bit computations in decoding. Using the URAM matrix format 200 enables the elimination of the swizzle logic circuits in the URAM encoder and decoder and the optimization of the overall logic, which results in logic usage savings, area savings, performance improvements, and power savings. In an example, comparing to the URAM encoder and decoder of FIGS. 3 and 4, the elimination of the swizzle logic circuits saves an area of about at least 100 square microns ($\mu m^2$), improves the worst case timing path of the ECC by at least about 50 picoseconds, and saves logic usage by at least about 15%.

Figure 6:
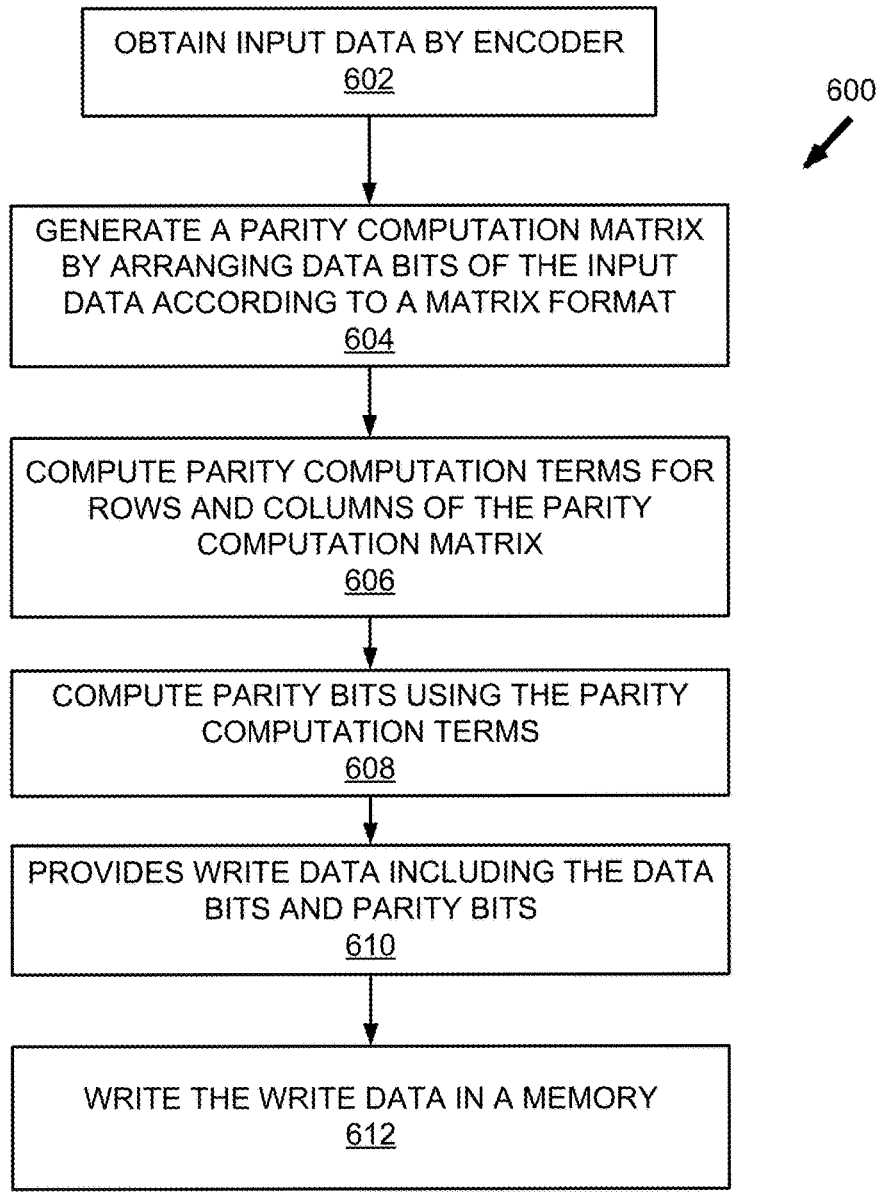
FIG. 6 is a flow diagram illustrating an exemplary method for performing an encoding method according to some embodiments of the present disclosure.
Figure 7:
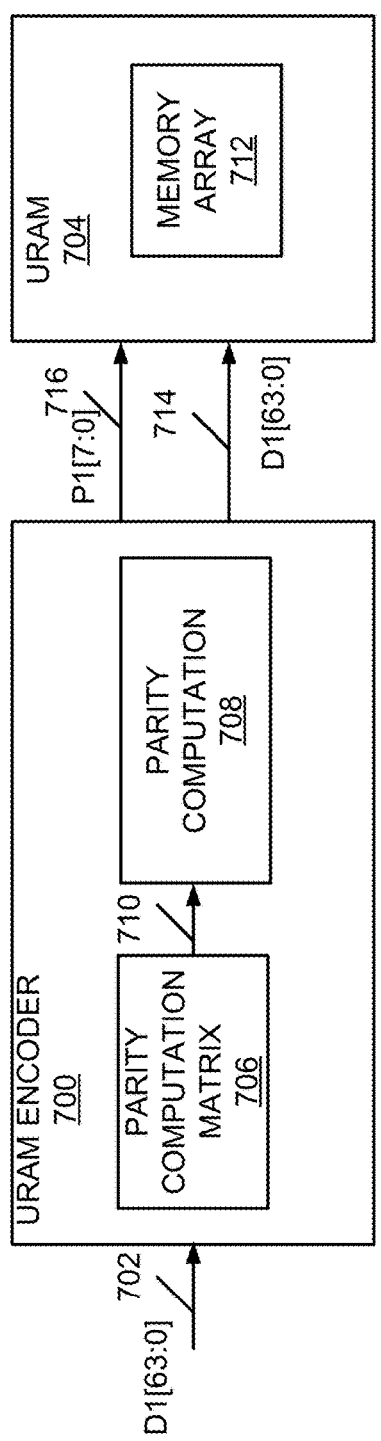
FIG. 7 is a block diagram illustrating an exemplary embodiment of an encoder according to some embodiments of the present disclosure.

Referring to FIGS. 6 to 10H, an embodiment of an encoding method 600 using the URAM matrix format 200 is described. Referring to FIG. 6, the method 600 begins at block 602, where an encoder obtains input data. Referring to FIG. 7, at block 602, a URAM encoder 700 obtains a signal 702 including input data D1[63:0] to be written to a sixty-four-bit wide URAM 704.

Figure 8:
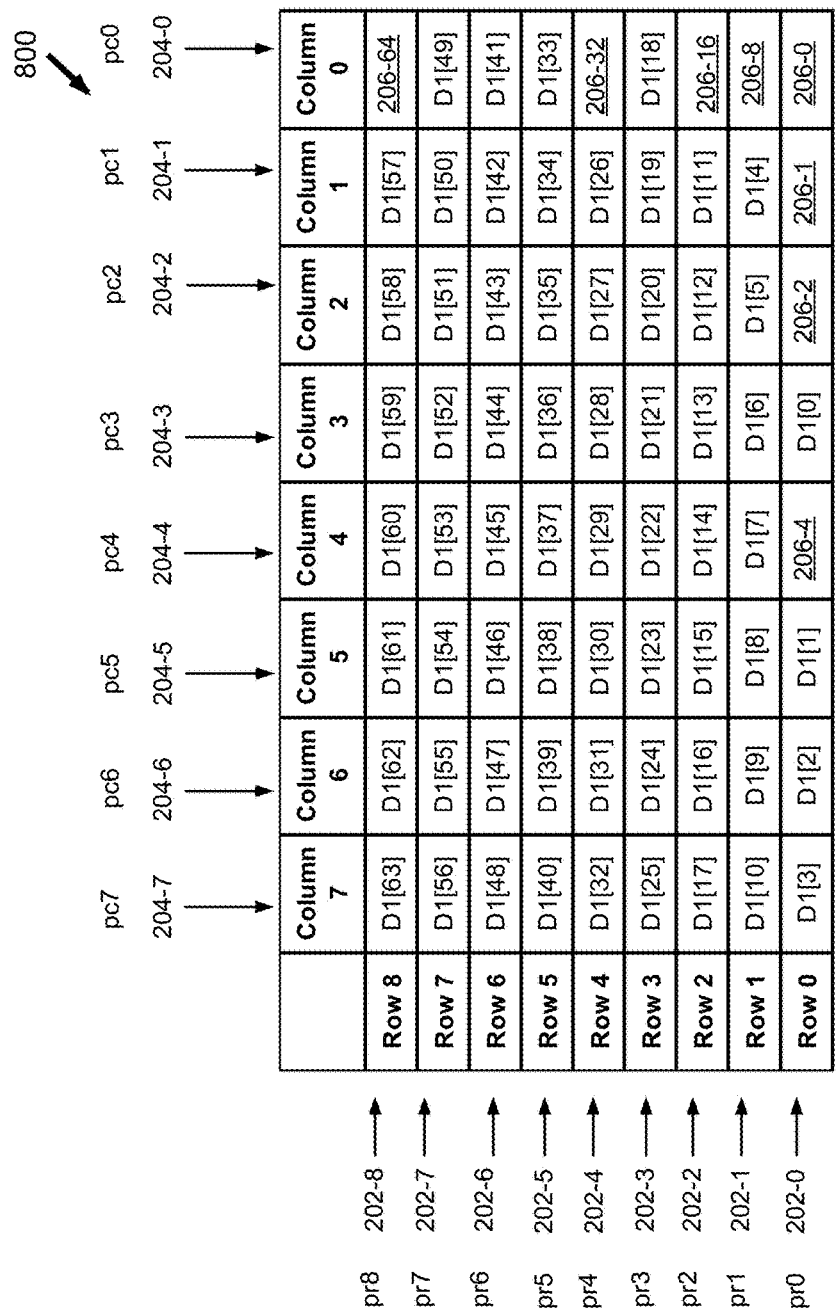
FIG. 8 is a block diagram illustrating an exemplary parity computation matrix according to some embodiments of the present disclosure.

The method 600 may then proceed to block 604, where a parity computation matrix is generated by arranging data bits of the input data according to the URAM matrix format 200. Referring to FIGS. 7 and 8, in the URAM encoder 700, input data D1[63:0] is sent to a parity computation matrix block 706, which generates a parity computation matrix 800 according to the URAM matrix format 200. At block 604, matrix cells 206-0, 206-1, 206-2, 206-4, 206-8, 206-16, 206-32, and 206-64 correspond to parity bits to be computed in subsequent steps, and are not occupied at this stage. The parity computation matrix block 706 may provide the parity computation matrix 800 at the signal 710 to a parity computation unit 708.

The method 600 may proceed to block 606, where parity computation terms for rows and columns of the parity computation matrix 800 are computed. Referring to FIGS. 7, 8, 9A, and 9B, in the URAM encoder 700, the parity computation unit 708 receives the signal 710 including the parity computation matrix 800. The parity computation terms may include parity computation row terms pr0 through pr8 corresponding to rows of the parity computation matrix 800, and parity computation column terms pc0 through pc7 corresponding to columns of the parity computation matrix 800. Referring to FIG. 9A, the parity computation unit 708 may compute parity computation row terms pr0 through pr8 for rows 202-0 through 202-8 of the parity computation matrix 800 using parity computation row term equations 900-0 through 900-8 respectively. In the notation of equations 900-0 through 900-8, the symbol "^" denotes a bitwise XOR operation. The notation D1[i] denotes the $i^{th}$ bit in the data bits D1[63:0]. Accordingly, a parity computation row term may be computed by performing XOR operations on all data bits in the corresponding row of the parity computation matrix 800. In some embodiments, pr0 is not used in computing the parity bits P1[0] through P1[7] as described below, and therefore may not be computed. Referring to FIG. 9B, similarly, the parity computation unit 708 may compute parity computation column terms pc0 through pc7 for columns 204-0 through 204-7 of the parity computation matrix 800 using parity computation column term equations 902-0 through 902-7 of FIG. 9B. In some embodiments, pc0 is not used in computing the parity bits P1[0] through P1[7] as described below, and therefore may not be computed. A parity computation column term may be computed by performing XOR operations on all data bits in the corresponding column of the parity computation matrix 800. The parity computation terms for the rows and columns of the parity computation matrix 800 may also be referred to as parity minterms.

Figure 10A:
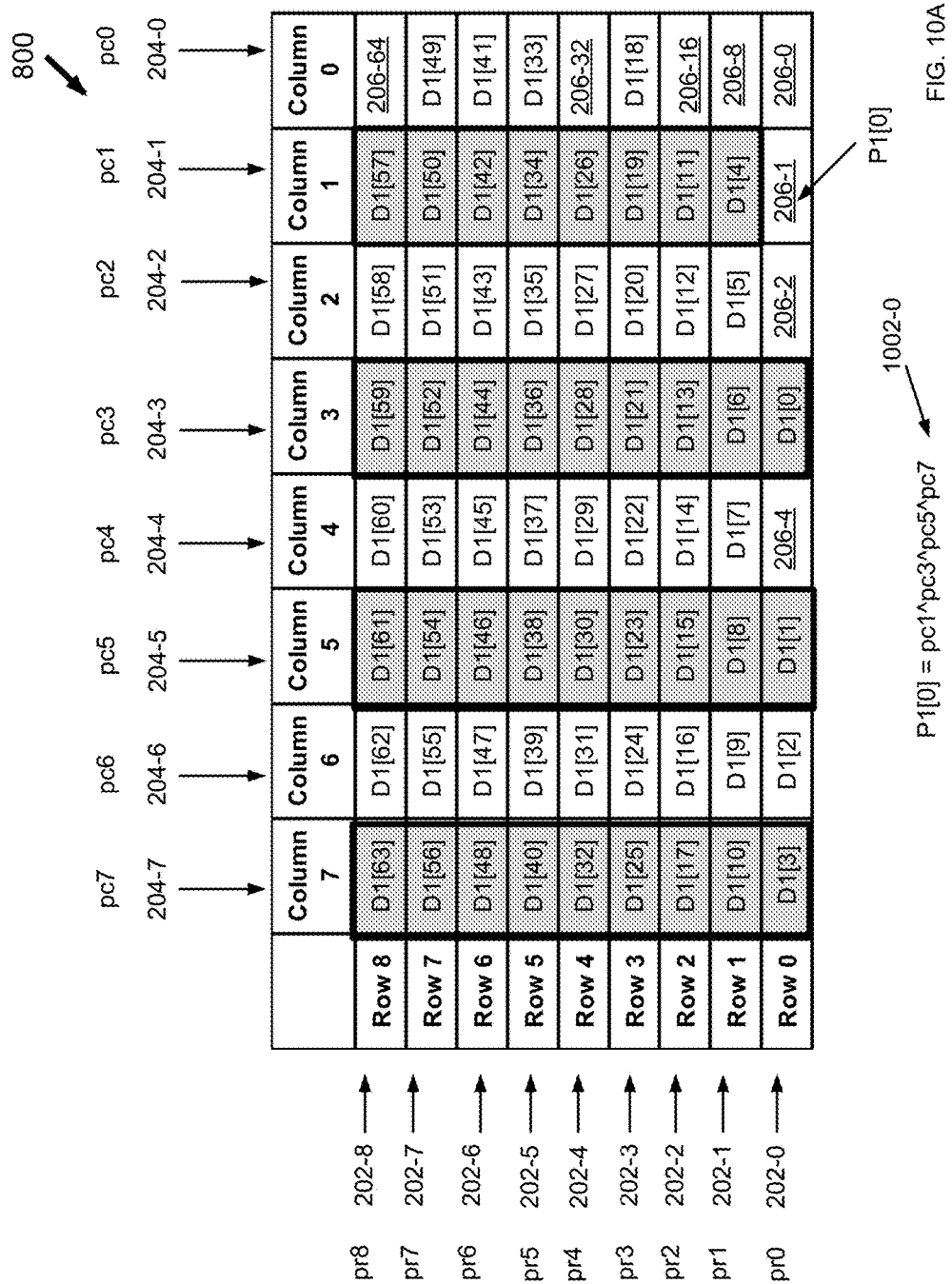
Figure 10B:
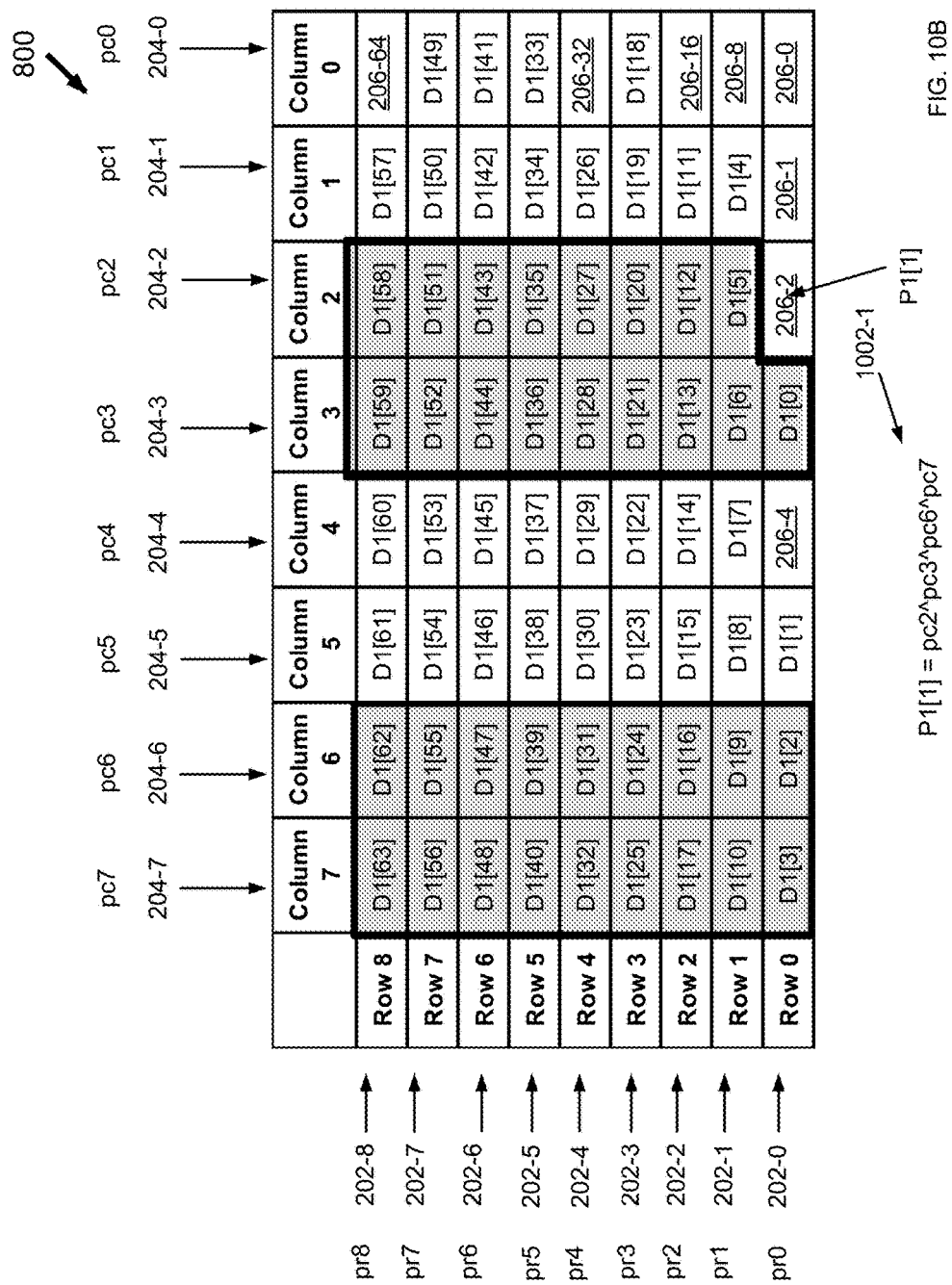
Figure 10C:
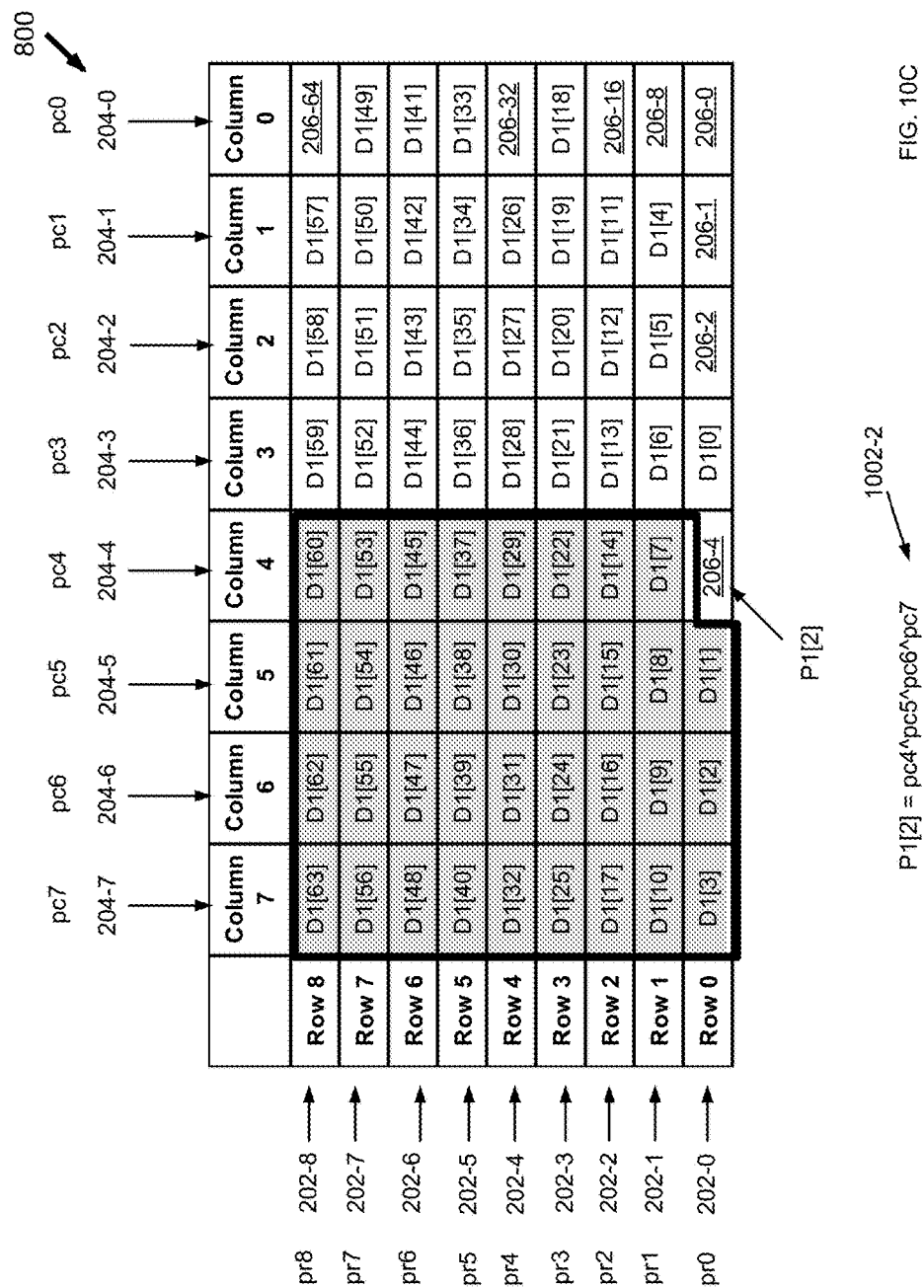

The method 600 may then proceed to block 608 to compute parity bits using the parity computation terms. Referring to FIGS. 7 and 10A to 10H, in the URAM encoder 700, the parity computation unit 708 may compute parity bits using the parity computation column terms pr0 through pr8 and the parity computation column terms pc0 through pc7. As shown in FIGS. 10A, 10B, and 10C, local column parity bits P1[0], P1[1], and P1[2] may be computed using parity computation column terms without using any parity computation row terms. As shown in FIGS. 10D, 10E, 10F, and 10G, local row parity bits P1[3], P1[4], P1[5], and P1[6] may be computed using parity computation row terms without using any parity computation column terms. As shown in FIG. 10H, the overall parity bit P1[7] may be computed using the local parity bits P1[6:0] together with either the parity computation column terms or the parity computation row terms.

Referring to FIGS. 10A, 10B, and 10C, in some embodiments, the local column parity bits P1[2:0] may be computed using the parity computation column terms. In some embodiments, the $i^{th}$ local column parity bit may cover data bits in every other $2^i$ column(s) of the parity computation matrix 800. Referring to FIG. 10A, local column parity bit P1[0] covers data bits in every other column of the parity computation matrix 800, including columns 204-1, 204-3, 204-5, and 204-7. As such, the local column parity bit P1[0] may be computed by performing an XOR operation on parity computation column terms pc1, pc3, pc5, and pc7 corresponding to those columns according to a parity computation equation 1002-0. After the computation, P1[0] may be inserted to the matrix cell 206-1 of the parity computation matrix 800. Referring to FIG. 10B, local column parity bit P1[1] may cover data bits in every other two columns of the parity computation matrix 800, including columns 204-2, 204-3, 204-6, and 204-7. As such, the local column parity bit P1[1] may be computed by performing an XOR operation on parity computation column terms pc2, pc3, pc6, and pc7 corresponding to those columns according to a parity computation equation 1002-1. P1[1] may then be inserted in the matrix cell 206-2 of the parity computation matrix 800. Referring to FIG. 10C, local column parity bit P1[2] may cover data bits in every other four columns of the parity computation matrix 800, including columns 204-4, 204-5, 204-6, and 204-7. As such, local column parity bit P1[2] may be computed by performing an XOR operation on parity computation column terms pc4, pc5, pc6, and pc7 corresponding to those columns according to a parity computation equation 1002-2. P1[2] may then be inserted in the matrix cell 206-4 of the parity computation matrix 800.

Figure 10D:
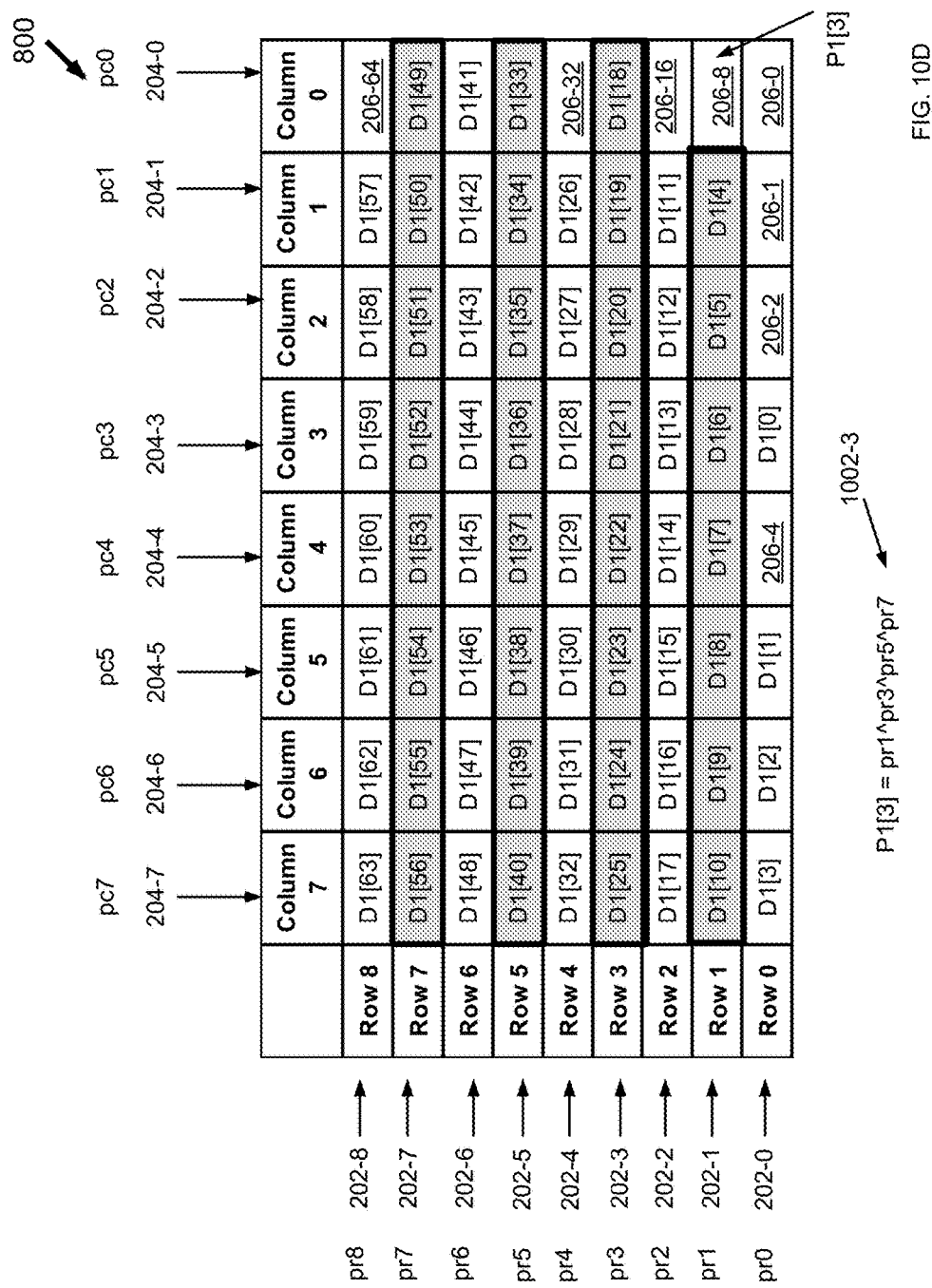
Figure 10E:
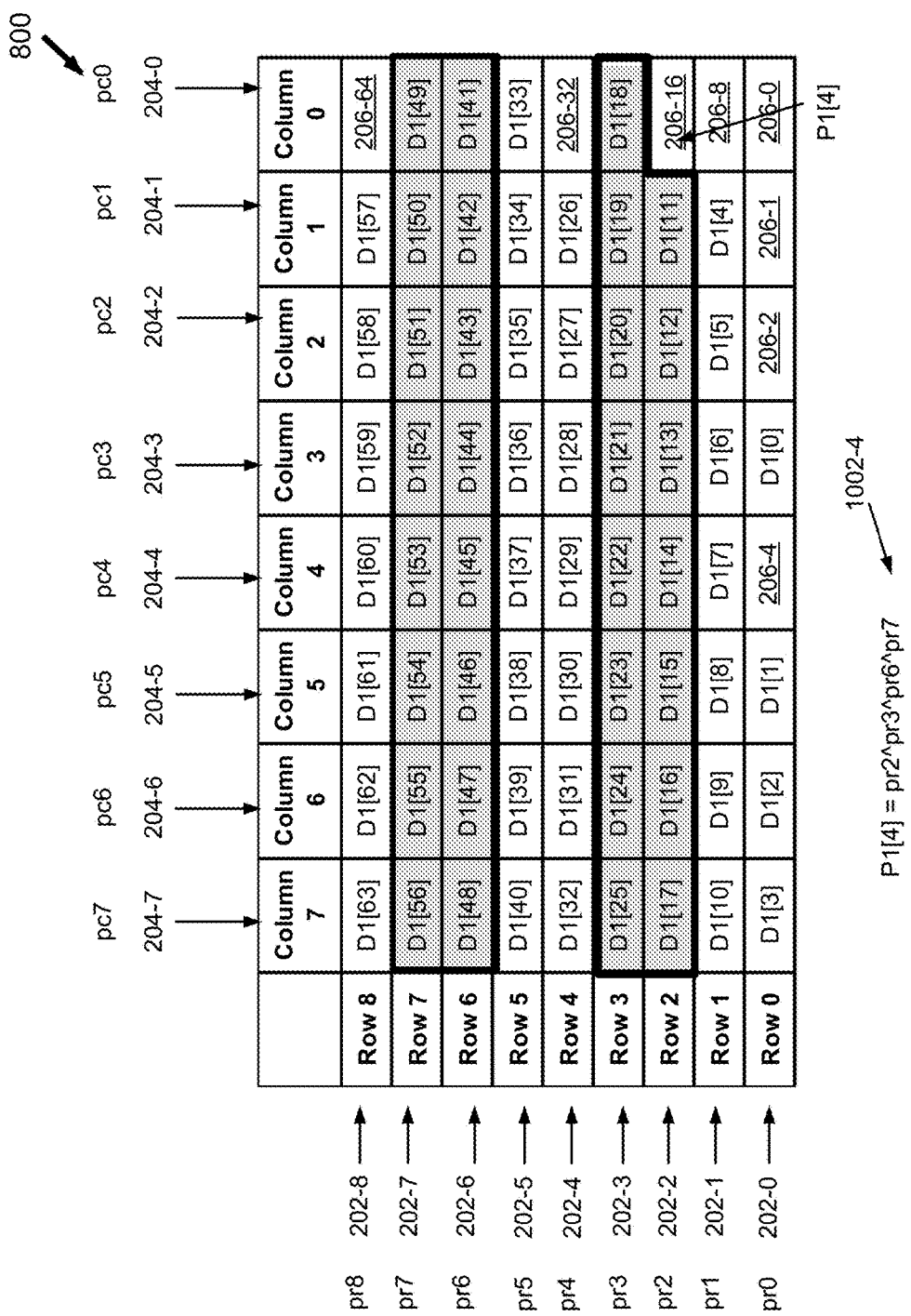
Figure 10F:
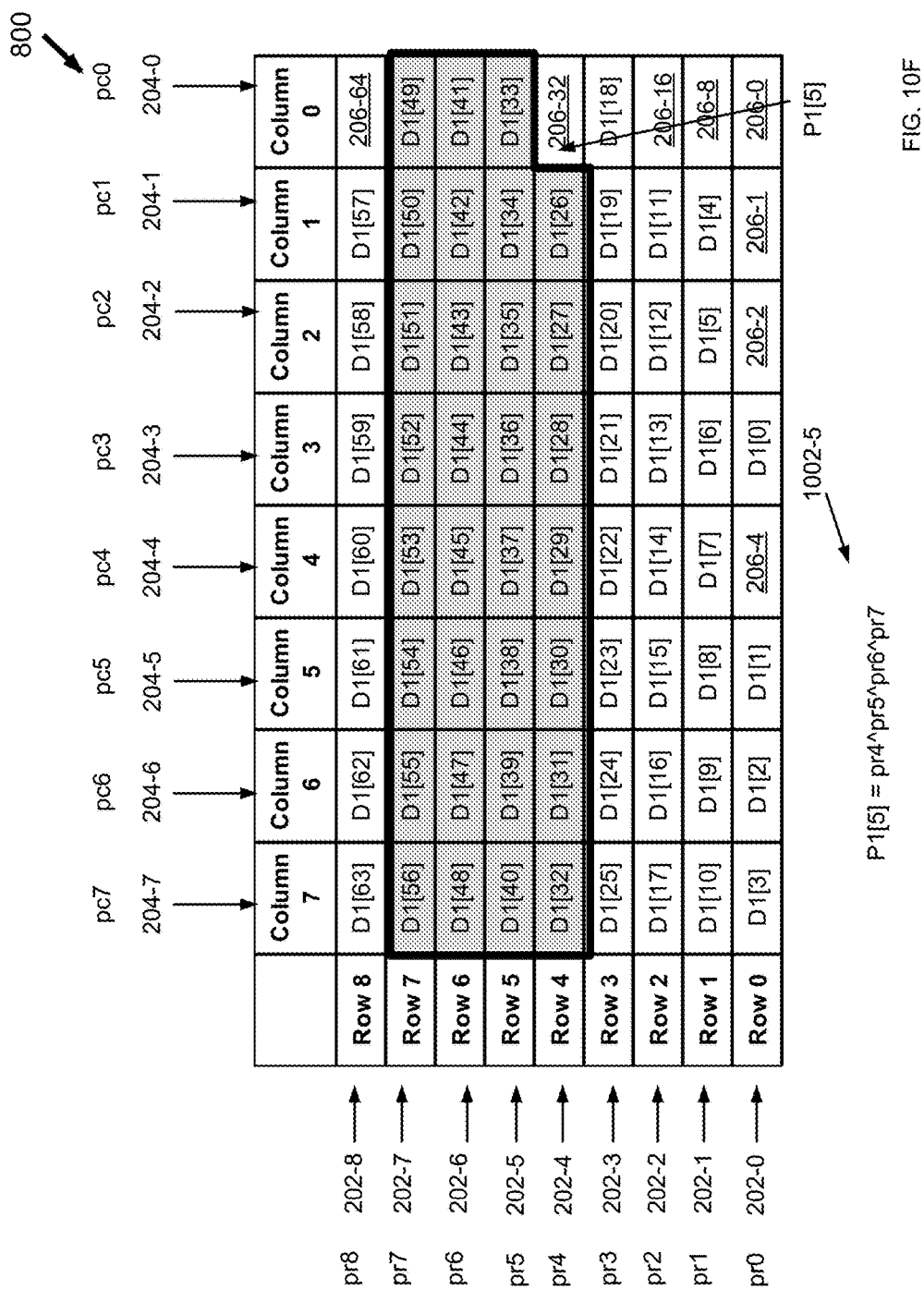
Figure 10G:
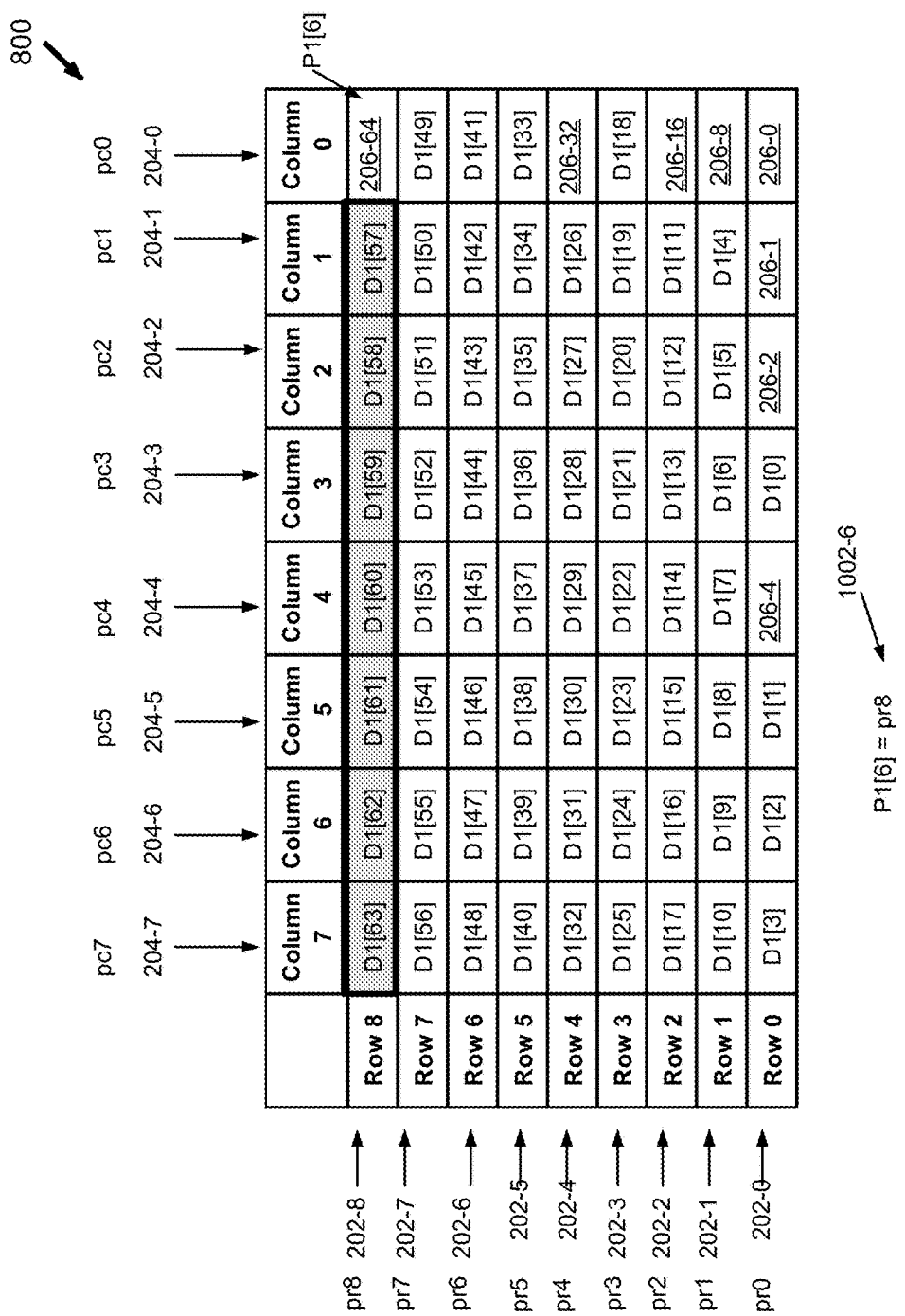
Figure 11:
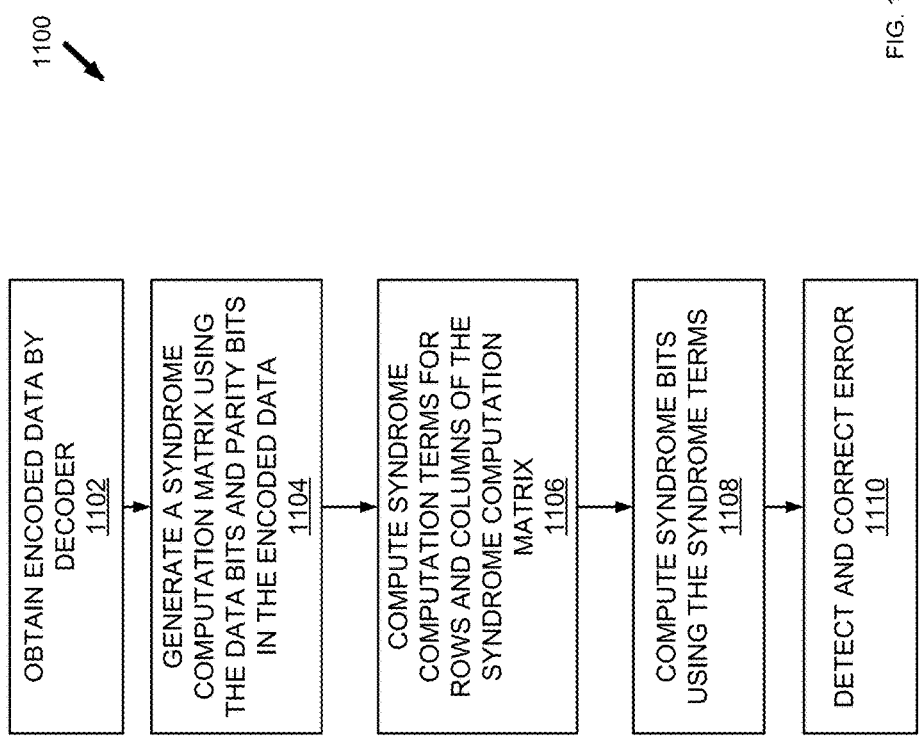
FIG. 11 is a flow diagram illustrating an exemplary method for performing a decoding method according to some embodiments of the present disclosure.

Referring to FIGS. 10D, 10E, 10F, and 10G, in some embodiments, the local row parity bits P1[6:3] may be computed using the parity computation row terms. In some embodiments, the $i^{th}$ local row parity bit may cover data bits in every other $2^i$ row(s) of the parity computation matrix 800. For example, P1[3] is the $0^{th}$ local row parity bit, and may cover data bits in every other row of the parity computation matrix 800. P1[4] is the 1st local row parity bit, and may cover data bits in every other $2^1$ rows of the parity computation matrix 800. P1[5] is the $2^{nd}$ local row parity bit, and may cover data bits in every other $2^2$ rows of the parity computation matrix 800. P1[6] is the $3^{rd}$ local row parity bit, and may cover data bits in every other eight rows of the parity computation matrix 800. Referring to FIG. 10D, local row parity bit P1[3] may cover data bits in every other row of the parity computation matrix 800, including rows 202-1, 202-3, 202-5, and 202-7. As such, local row parity bit P1[3] may be computed by performing an XOR operation on parity computation row terms pr1, pr3, pr5, and pr7 corresponding to those rows according to a parity computation equation 1002-3. P1[3] may then be placed in the matrix cell 206-8 of the parity computation matrix 800. Referring to FIG. 10E, local row parity bit P1[4] covers data bits in every other two rows of the parity computation matrix 800, including rows 202-2, 202-3, 202-6, and 202-7. In an example, parity bit P1[4] may be computed by performing an XOR operation on parity computation row terms pr2, pr3, pr6, and pr7 corresponding to those rows according to a parity computation equation 1002-4. The computed parity bit P1[4] may be placed in the matrix cell 206-16 of the parity computation matrix 800. Referring to FIG. 10F, local row parity bit P1[5] is computed using data bits in every other four rows of the parity computation matrix 800, including rows 202-4, 202-5, 202-6, and 202-7. Local row parity bit P1[5] may be computed by performing an XOR operation on parity computation row terms pr4, pr5, pr6, and pr7 corresponding to those rows according to a parity computation equation 1002-5. P1[5] may then be placed in the matrix cell 206-32 of the parity computation matrix 800. Referring to FIG. 10G, local row parity bit P1[6] covers data bits in every other eight rows of the parity computation matrix 800, including the row 202-8. As such, local row parity bit P1[6] has a value equal to the parity computation row term pr8 corresponding to the row 202-8 according to a parity computation equation 1002-6. P1[6] may then be placed in the matrix cell 206-64 of the parity computation matrix 800.

Referring to FIG. 10H, in some embodiments, an overall parity bit P1[7] may cover the local parity bits P1[6:0] and the data bits D1[63:0]. In an example where the parity column term pc0 is not computed, the overall parity bit P1[7] may be computed using the local parity bits P1[6:0], the parity column terms pc1 through pc7, and the data bits D1[18], D1[33], D1[41], and D1[49] in column 204-0 according to the parity computation equation 1002-7. In another example, the overall parity bit P1[7] may be computed using the local parity bits P1[6:0] and the parity column terms pc0 through pc7 according to the parity computation equation 1002-8. In yet another example, the overall parity bit P1[7] may be may be computed using the local parity bits P1[6:0] and the parity row terms pr0 through pr8. P1[7] may then be placed in the matrix cell 206-0 of the parity computation matrix 800. It is noted that the actual order of determining local parity bits P1[6:0] may be irrelevant, and any order of determination may be used. But in some embodiments, the overall parity bit P1[7] is determined after the determination of local parity bits P1[6:0].

The method 600 may then proceed to block 610, where the URAM encoder 700 provides write data (encoded data) including the data bits D1[63:0] and the parity bits P1[7:0]. As shown in FIG. 7, the URAM encoder 700 may output a signal 716 providing the parity bits P1[7:0], and output a signal 714 providing the data bits D1[63:0].

The method 600 may then proceed to block 612, where the write data may be written in a memory. Referring to FIG. 7, the URAM 704 may receive the write data including D1[63:0] and P1[7:0], and write the write data to a memory array 712 (e.g., by a write circuit coupled to the URAM 704).

Figure 12:
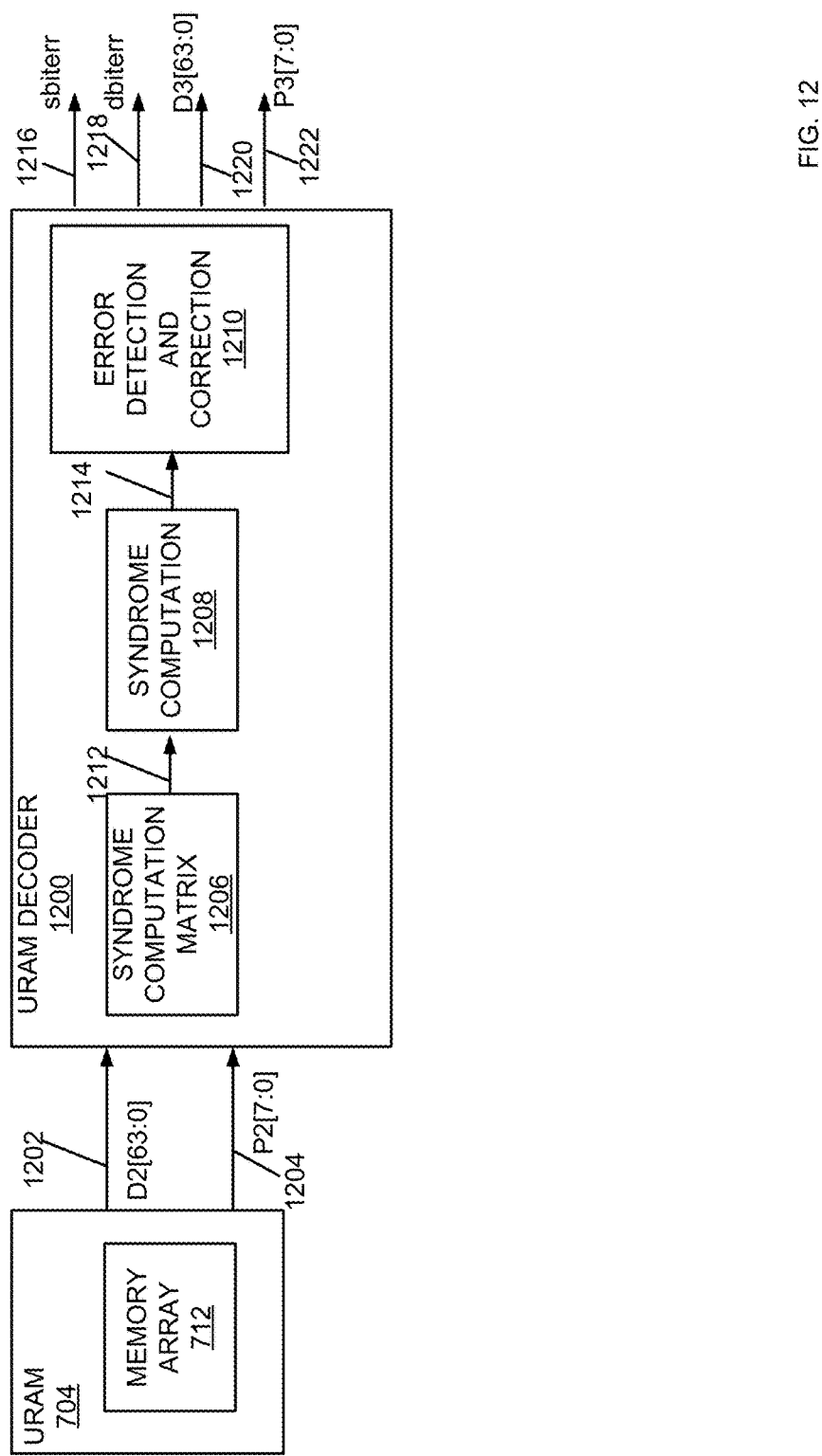
FIG. 12 is a block diagram illustrating an exemplary embodiment of a decoder according to some embodiments of the present disclosure.

Referring to FIGS. 11 to 15H, an embodiment of a decoding method 1100 is described. The method 1100 begins at block 1102, where a decoder obtains encoded data. Referring to FIG. 12, at block 1102, the URAM decoder 1200 obtains encoded data including data bits D2[63:0] from a signal 1202 and parity bits P2[7:0] from a signal 1204. In some embodiments, the encoded data is read from the memory array 712 of the URAM 704 during a read operation, and may also be referred to as read data.

The method 1100 may then proceed to block 1104, where a syndrome computation matrix is generated using data bits D2[63:0] and parity bits P2[7:0] of the encoded data. Referring to FIGS. 12 and 13, the URAM decoder 1200 includes a syndrome computation matrix unit 1206, which arranges the data bits D2[63:0] and parity bits P2[7:0] in the encoded data according to the URAM matrix format 200 to generate a syndrome computation matrix 1300. At block 1104, all seventy-two matrix cells of the syndrome computation matrix 1300 are occupied with the sixty-four data bits of D2[63:0] and the eight parity bits of P2[7:0]. The syndrome computation matrix unit 1206 may then provide the syndrome computation matrix 1300 in a signal 1212 to a syndrome computation unit 1208.

The method 1100 may then proceed to block 1106, where syndrome computation terms for rows and columns of the syndrome computation matrix 1300 are computed. Referring to FIGS. 12, 13, 14A, and 14B, in the URAM decoder 1200, the syndrome computation unit 1208 receives the signal 1212 providing the syndrome computation matrix 1300, and compute syndrome computation terms including syndrome computation row terms sr0 through sr8 and syndrome computation column terms sc0 through sc7. Referring to FIG. 14A, the syndrome computation unit 1208 may compute syndrome computation row terms sr0 through sr8 for rows 202-0 through 202-8 of the syndrome computation matrix 1300 using syndrome computation row term equations 1400-0 through 1400-8. In the notation of equations 1400-0 through 1400-8, the symbol "^" denotes a bitwise XOR operation. The notation D2[i] denotes the $i^{th}$ bit in the data bits D2[63:0], and P2[i] denotes the $i^{th}$ bit in the parity bits P2[7:0]. Accordingly, a syndrome computation row term may be computed by performing XOR operations on all data bits and parity bits in the corresponding row of the syndrome computation matrix 1300. In some embodiments, sr0 is not used in computing the syndrome bits S[0] through S[7] as described below, and therefore may not be computed. Referring to FIG. 14B, similarly, the syndrome computation unit 1208 may compute syndrome computation column terms sc0 through sc7 for columns 204-0 through 204-7 of the syndrome computation matrix 1300 using syndrome computation column term equations 1402-0 through 1402-7 of FIG. 14B. A syndrome computation column term may be computed by performing XOR operations on all data bits and parity bits in the corresponding column of the syndrome computation matrix 1300. In some embodiments, sc0 is not used in computing the syndrome bits S[0] through S[7] as described below, and therefore may not be computed. The syndrome computation terms computed for the rows and columns of the syndrome computation matrix 1300 may also be referred to as syndrome minterms.

Figure 15A:
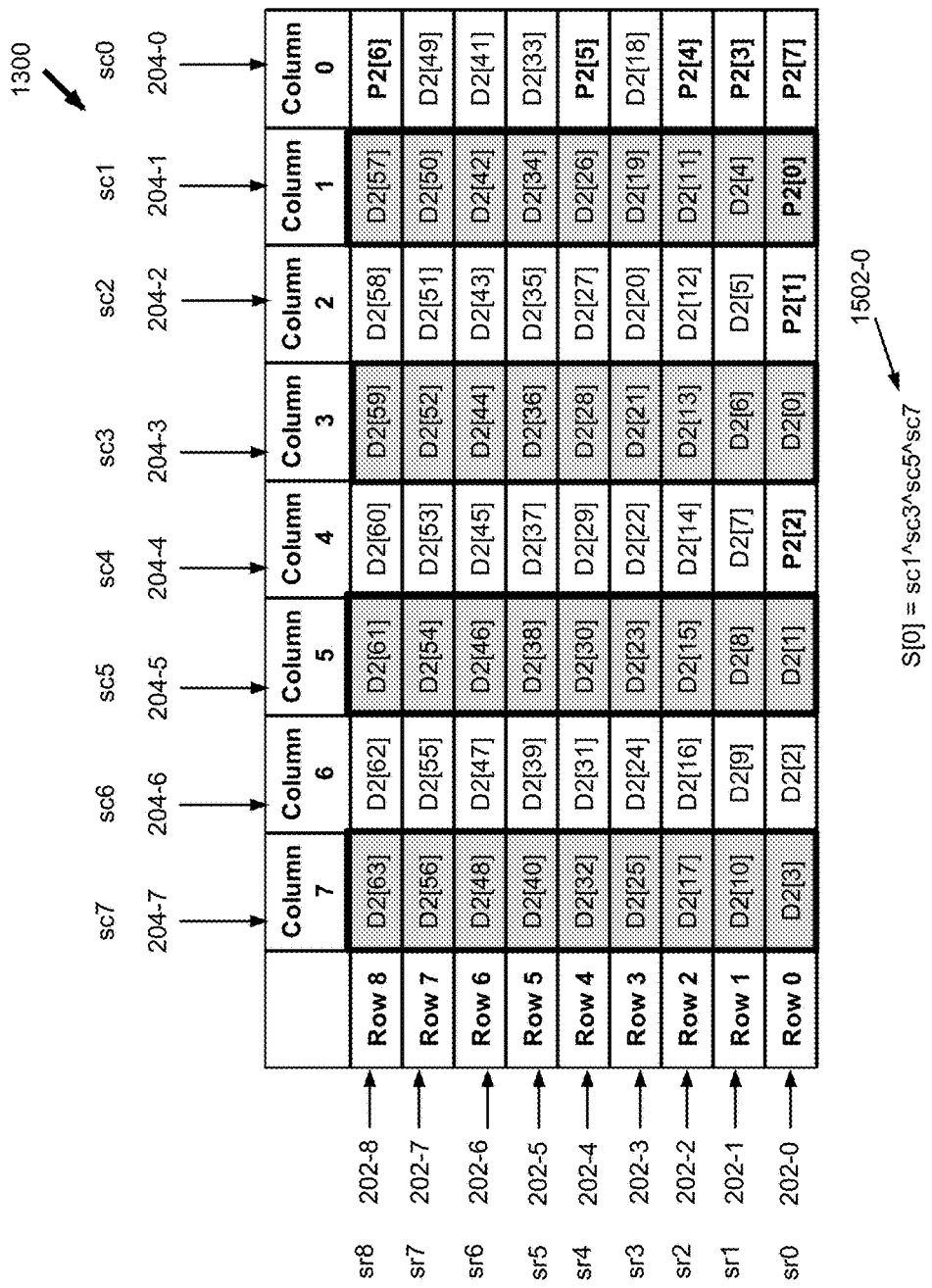
Figure 15B:
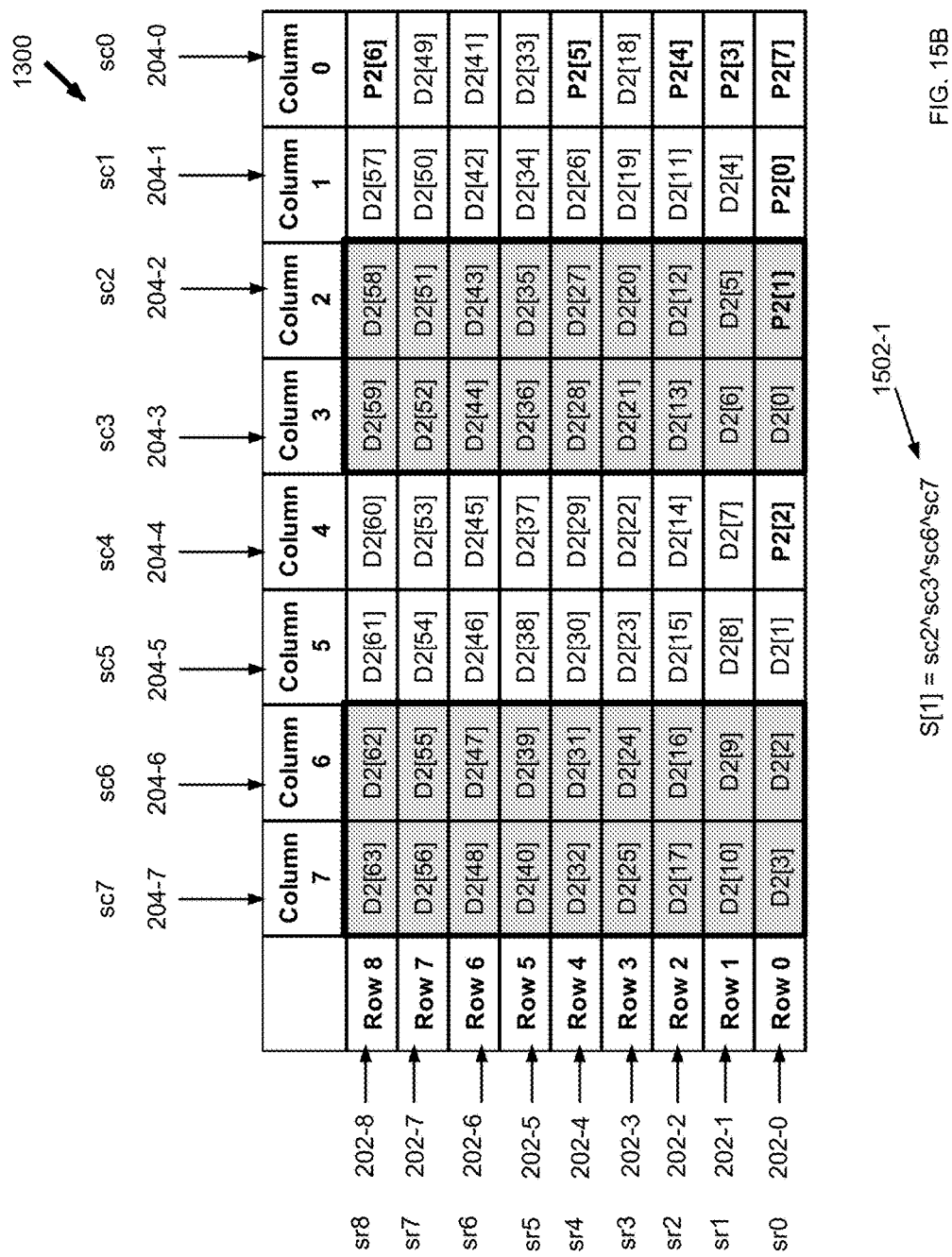

The method 1100 may then proceed to block 1108, where syndrome bits are computed using the syndrome computation terms. Referring to FIGS. 12, and 15A to 15H, in the URAM decoder 1200, the syndrome computation unit 1208 may compute syndrome bits S[7:0] using the syndrome computation column terms and syndrome computation row terms. Each of the syndrome bits S[6:0] may be computed using a subset of the data bits D2[63:0] and parity bits P2[7:0], and is also referred to as a local syndrome bit. The syndrome bit S[7] may be computed using all of the parity bits P2[7:0] and the data bits D2[63:0], and is also referred to as an overall syndrome bit S[7] or a global syndrome bit S[7]. As shown in the examples of FIGS. 15A, 15B, and 15C, syndrome bits S[0], S[1], and S[2] may be computed using syndrome computation column terms without using any syndrome computation row terms, and may be referred to as local column syndrome bits S[0], S[1], and S[2]. As shown in the examples of FIGS. 15D, 15E, 15F, and 15G, syndrome bits S[3], S[4], S[5], and S[6] may be computed using syndrome computation row terms without using any syndrome computation column terms, and may be referred to as local row syndrome bits S[3], S[4], S[5], and S[6]. As shown in the example of FIG. 15H, S[7] may be computed using the data bits D2[63:0] and parity bits P2[7:0], and may be referred to as an overall syndrome bit S[7].

Referring to FIGS. 15A, 15B, and 15C, in some embodiments, the local column syndrome bits S[2:0] may be computed using the syndrome computation column terms. In some embodiments, the $i^{th}$ local column syndrome bit covers data bits and parity bits in every other $2^i$ column(s) of the syndrome computation matrix 1300. For example, the local column syndrome bit S[0] may cover data bits and parity bits in every other column of the syndrome computation matrix 1300. The local column syndrome bit S[1] may cover data bits and parity bits in every other two columns of the syndrome computation matrix 1300. The local column syndrome bit S[2] may cover data bits and parity bits in every other four columns of the syndrome computation matrix 1300. Referring to FIG. 15A, the local column syndrome bit S[0] covers data bits and parity bits in every other column of the syndrome computation matrix 1300, including columns 204-1, 204-3, 204-5, and 204-7. As such, the local column syndrome bit S[0] may be computed by performing an XOR operation on syndrome computation column terms sc1, sc3, sc5, and sc7 corresponding to those columns according to a syndrome computation equation 1502-0. Referring to FIG. 15B, the local column syndrome bit S[1] covers data bits and parity bits in every other two columns of the syndrome computation matrix 1300, including columns 204-2, 204-3, 204-6, and 204-7. As such, the local column syndrome bit S[1] may be computed by performing an XOR operation on syndrome computation column terms sc2, sc3, sc6, and sc7 corresponding to those columns according to a syndrome computation equation 1502-1. Referring to FIG. 15C, the local column syndrome bit S[2] covers data bits and parity bits in every other four columns of the syndrome computation matrix 1300, including columns 204-4, 204-5, 204-6, and 204-7. As such, the local column syndrome bit S[2] may be computed by performing an XOR operation on syndrome computation column terms sc4, sc5, sc6, and sc7 corresponding to those columns according to a syndrome computation equation 1502-2.

Figure 15E:
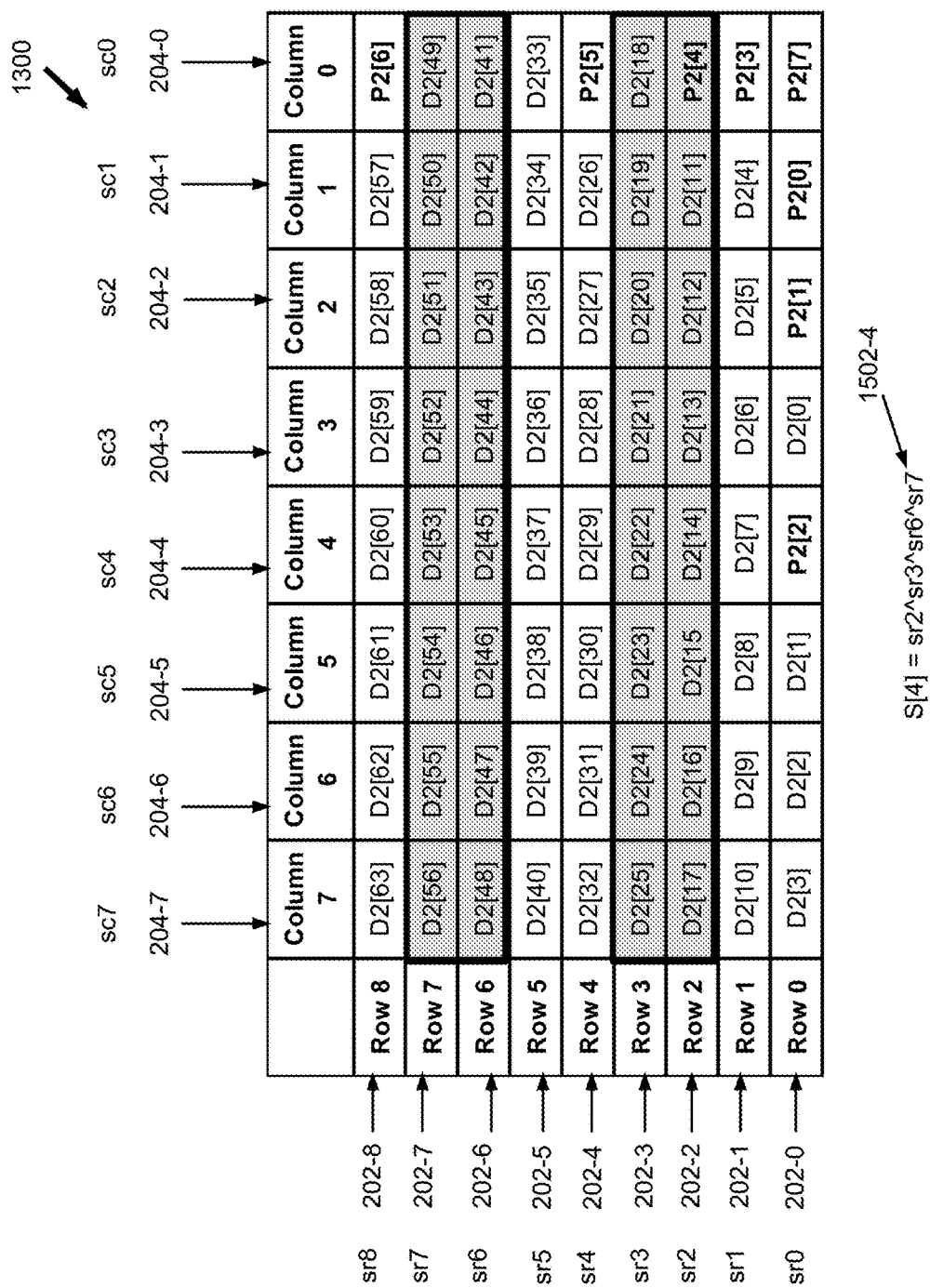
Figure 15H:
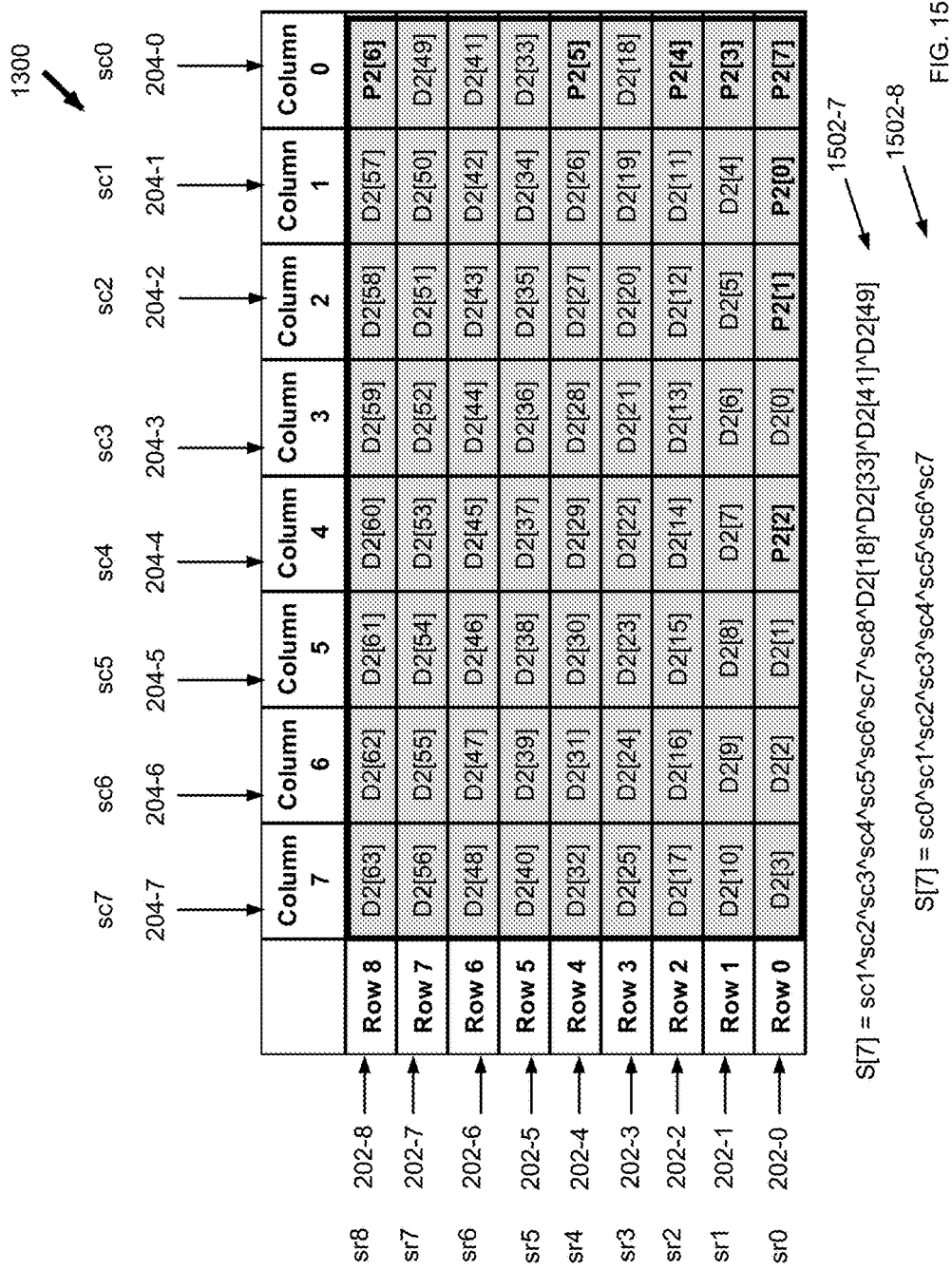

Referring to FIGS. 15D, 15E, 15F, and 15G, in some embodiments, the local row syndrome bits S[6:3] may be computed using the syndrome computation row terms. In some embodiments, the $i^{th}$ local row syndrome bit cover data bits and parity bits in every other $2^i$ row(s) of the syndrome computation matrix 1300. For example, the local row syndrome bit S[3] is the $0^{th}$ local row syndrome bit, and covers data bits and parity bits in every other row of the syndrome computation matrix 1300. The local row syndrome bit S[4] is the $1^{st}$ local row syndrome bit, and covers data bits and parity bits in every other two rows of the syndrome computation matrix 1300. The local row syndrome bit S[5] is the $2^{nd}$ local row syndrome bit, and covers data bits and parity bits in every other four rows of the syndrome computation matrix 1300. The local row syndrome bit S[6] is the $3^{rd}$ local row syndrome bit, and covers data bits and parity bits in every other eight rows of the syndrome computation matrix 1300. Referring to FIG. 15D, the local row syndrome bit S[3] covers data bits and parity bits in every other row of the syndrome computation matrix 1300, including rows 202-1, 202-3, 202-5, and 202-7. As such, the local row syndrome bit S[3] may be computed by performing an XOR operation on syndrome computation row terms sr1, sr3, sr5, and sr7 corresponding to those rows according to a syndrome computation equation 1502-3. Referring to FIG. 15E, the local row syndrome bit S[4] covers data bits and parity bits in every other two rows of the syndrome computation matrix 1300, including rows 202-2, 202-3, 202-6, and 202-7. As such, the local row syndrome bit S[4] may be computed by performing an XOR operation on syndrome computation row terms sr2, sr3, sr6, and sr7 corresponding to those rows according to a syndrome computation equation 1502-4. Referring to FIG. 15F, the local row syndrome bit S[5] covers data bits and parity bits in every other four rows of the syndrome computation matrix 1300, including rows 202-4, 202-5, 202-6, and 202-7. As such, the local row syndrome bit S[5] may be computed by performing an XOR operation on syndrome computation row terms sr4, sr5, sr6, and sr7 corresponding to those rows according to a syndrome computation equation 1502-5. Referring to FIG. 15G, the local row syndrome bit S[6] covers data bits and parity bits in every other eight rows of the syndrome computation matrix 1300, including the row 202-8. As such, the local row syndrome bit S[6] has a value equal to the row term sr8 corresponding to the row 202-8 according to a syndrome computation equation 1502-6.

Referring to FIG. 15H, in some embodiments, an overall syndrome bit S[7] may be computed using the parity bits P2[7:0] and the data bits D2[63:0]. In an example where the syndrome column term sc0 is not computed, the overall syndrome bit S[7] may be computed using the syndrome column terms sc1 through sc7 and data bits D1[18], D2[33], D2[41], and D2[49] in column 204-0 according to the syndrome computation equation 1502-7. In another example, the overall syndrome bit S[7] may be computed using the syndrome column terms sc0 through sc7 according to the syndrome computation equation 1502-8. In yet another example, the overall syndrome bit S[7] may be computed using the syndrome row terms sr0 through sr8. It is noted that the actual order of determining local parity bits P[6:0] may be irrelevant, and any order of determination may be used. But in some embodiments, the overall parity bit P[7] is determined after the determination of local parity bits P[6:0].

The method 1100 may then proceed to block 1110, wherein errors in the read data are detected and corrected where applicable. Referring to FIG. 12, the syndrome computation unit 1208 may send a signal 1214 including the syndrome bits S[7:0] to an error detection and correction unit 1210. Based on the syndrome bits, the error detection and correction unit 1210 may determine an error type.

In some examples, the overall syndrome bit S[7] has a value of one. In such examples, the error detection and correction unit 1210 may detect an error type of a single bit error and in response, perform an error correction operation to correct the single bit error. The location L of the single bit error may be determined using local syndrome bits S[6:0] as follows:

$$L=2^0*S[0]+2^1*S[1]+2^2*S[2]+2^3*S[3]+2^4*S[4]+2^5*S[5]+2^6*S[6].$$

In an example where S[7] has a value of one and all syndrome bits S[6:0] are zero, the location L of the single bit error is equal to zero, which indicates that the overall parity bit P2[7] is in error. In such an example, an error correction may be performed to the overall parity bit P2[7]. The error detection and correction unit 1210 may provide an error status indicating that a single bit error is detected and corrected. In such examples, signals 1216 and 1218 may provide a sbiterr bit having a value of one, and a dbiterr bit having a value of zero.

In some examples, all syndrome bits S[7:0] have a value of zero. In such examples, an error status indicating no error is provided, where both sbiterr and dbiterr provided by signals 1216 and 1218 have a value of zero.

In some examples, the overall syndrome bit S[7] has a value of zero and at least one of the syndrome bits S[6:0] is not equal to zero. In such examples, a double bit error is detected but not corrected. An error status indicating that a double bit error is detected is provided, where sbiterr provided by the signal 1216 has a value of zero, and dbiterr provided by the signal 1218 has a value of one.

As shown in FIG. 12, the URAM decoder 1200 may provide the corrected data D3[63:0] (decoded read data) at an output 1220, and provide the parity bits P3[7:0] at an output 1222.

The URAM encoder 700 and the URAM decoder 1200 and each of their blocks may be implemented in hardware, software, or a combination of hardware and software. The URAM encoder 700 and the URAM decoder 1200 and each of their blocks may be implemented using a computer system with a processor and memory configured to execute software, or as an application specific integrated circuit, that are configured to perform the operations described herein. In some embodiments, the URAM encoder 700 and the URAM decoder 1200 and each of their blocks may be implemented as a circuit within a field programmable gate array (FPGA), such as the FPGA described below with respect to FIG. 1.

Referring to FIGS. 16A and 16B, in some embodiments, by arranging the data bits and parity bits according to a matrix format, computation terms computed according to rows and/or columns of the matrix format may be used in parity bits and/syndrome bits computations. As such, the parity bits and/syndrome bits computations may be optimized, and the overall logic (e.g., XOR gates) may be reduced significantly, thereby achieving area and power savings. In some embodiments, for ECC(72, 64) implementing a (72, 64) Hamming code, by utilizing parity minterms and syndrome minterms, a logic reduction of about 45% or more may be achieved. For example, an encoder of ECC(72, 64) that does not use parity minterms may require about 256 two-input XOR gates for computing parity bits. For further example, a decoder of ECC(72, 64) that does not use syndrome minterms may require about 264 two-input XOR gates for computing syndrome bits. Referring to FIGS. 16A and 16B, illustrated therein are exemplary two-input XOR gate numbers 1602 indicating the total number of two-input XOR gates that may be used to compute parity bits and syndrome bits using parity minterms and syndrome minterms respectively. For example, as shown in FIG. 16A, by utilizing parity minterms pr1 through pr8 and pc1 through pc7 to compute parity bits P1[0] through P1[7] (e.g., according to equations 900-1 through 900-8, 902-1 through 902-7, and 1002-0 through 1002-7), the parity bits computation may be implemented using about 140 two-input XOR gates. As such, a logic reduction of about 45% is achieved compared to the encoder of ECC(72, 64) that does not use such parity minterms. For further example, as shown in FIG. 16B, by utilizing syndrome minterms sr1 through sr8 and sc1 through sc7 to compute syndrome bits S[0] through S[7] (e.g., according to equations 1400-1 through 1400-8, 1402-1 through 1402-7, and 1502-0 through 1502-7) the syndrome bits computation may be implemented using about 138 two-input XOR gates. As such, a logic reduction of about 48% compared to the encoder of ECC(72, 64) that does not use such syndrome minterms.

In some embodiments, by utilizing parity minterms and syndrome minterms to compute parity bits and syndrome bits in the manner described above, for ECC that implements a Hamming code including a larger number of data bits, a greater logic reduction may be achieved, thereby achieving more area and power savings. For example, for ECC(137, 128) implementing a (137, 128) Hamming code, by utilizing parity minterms and syndrome minterms, a logic reduction of more than 50% may be achieved. In an example, an encoder of ECC(137, 128) that does not use parity minterms may require about 593 two-input XOR gates for computing parity bits. On the other hand, by utilizing parity minterms to compute parity bits (e.g., based on a matrix format 250 in the manner described above), the parity bits computation may be implemented using about 282 two-input XOR gates. As such, a logic reduction of about 52% is achieved. For further example, a decoder of ECC(137, 128) that does not use syndrome minterms may use over six hundred (e.g., 602) two-input XOR gates for computing syndrome bits. On the other hand, by utilizing syndrome minterms to compute syndrome bits (e.g., based on a matrix format 250 in the manner described above), the syndrome bits computation may be implemented using about 291 two-input XOR gates. As such, a logic reduction of about 52% is achieved.

It is noted that various configurations illustrated in FIGS. 2 to 16B are exemplary only and not intended to be limiting beyond what is specifically recited in the claims that follow. It will be understood by those skilled in that art that other configurations may be used. For example, the matrix format 200 may be extended to a Hamming code including different data bits and parity bits, and may be used in a memory that has a width that is either less than sixty-four bits or greater than sixty-four bits. For further example, while exemplary parity computation equations and syndrome computation equations are provided, other equations for computing the parity bits and syndrome bits may be used. In an example, syndrome minterms may be computed without any of parity bits P2[7:0], and syndrome bits may them be computed using the syndrome minterms and the corresponding parity bits.

Various advantages may be present in various applications of the present disclosure. No particular advantage is required for all embodiments, and different embodiments may offer different advantages. One of the advantages of some embodiments is that by using a matrix format designed based on a particular width of a memory and/or the Hamming code used in the ECC, one or more swizzle logic circuits may be eliminated in the ECC, thereby eliminating area overhead, power usage, and delay penalty caused by those swizzle logic circuits. Another of the advantages of some embodiments is that by arranging data bits and/or parity bits according to the matrix format in a symmetric manner, computation terms may be reused in computing different parity bits and/or syndrome bits, which optimizes the overall logic, saves area and power, and improves the delay of the ECC.

Although particular embodiments have been shown and described, it will be understood that it is not intended to limit the claimed inventions to the preferred embodiments, and it will be obvious to those skilled in the art that various changes and modifications may be made without department from the spirit and scope of the claimed inventions. The specification and drawings are, accordingly, to be regarded in an illustrative rather than restrictive sense. The claimed inventions are intended to cover alternatives, modifications, and equivalents.

What is claimed is:

1. An integrated circuit (IC), comprising:
   an encoder configured to receive input data including a plurality of data bits, the encoder including:
      a first matrix circuit configured to arrange the data bits according to a matrix format to generate a parity matrix having a first set of matrix cells including the data bits and a second set of matrix cells corresponding to parity bits; and
      a parity circuit including a first set of logic gates configured to determine a plurality of parity row minterms corresponding to rows of the parity matrix respectively, a second set of logic gates configured to determine a plurality of parity column minterms corresponding to columns of the parity matrix respectively, and a third set of logic gates configured to determine at least some of the parity bits using the parity row and column minterms, wherein after the parity bits are determined, the parity bits are written into the second set of matrix cells; and
   an output portion configured to provide write data including the data bits and the parity bits to a write circuit, wherein the write circuit writes the write data to a memory cell array in a memory, and wherein the matrix format is configured based on a width of the memory to provide alignment between the write data and the memory.

2. The IC of claim 1, wherein the matrix format is configured based on a first total number of the parity bits and a second total number of the data bits, such that the data bits and parity bits are arranged in the matrix format in a symmetric manner.

3. The IC of claim 2, wherein the parity bits include:
   a first number of local column parity bits;
   a second number of local row parity bits; and
   an overall parity bit; and
   wherein the matrix format is configured so that the local column parity bits are located in a parity bit row of the matrix format, and the local row parity bits are located in a parity bit row of the parity matrix.

4. The IC of claim 3, wherein the first number of local column parity bits are generated using the plurality of column minterms;
   wherein the second number of local row parity bits are generated using the plurality of parity row minterms; and
   wherein the overall parity bit is generated using the local column parity bits, the local row parity bits, and the plurality of parity column minterms.

5. The IC of claim 3, wherein a difference between the first number and the second number is equal to or less than one.

6. The IC of claim 5, wherein an $i^{th}$ local column parity bit of the first number of local column parity bits is generated using column minterms corresponding to every other $2^i$ column(s) of the parity matrix; and
   wherein a $j^{th}$ local row parity bit of the second number of local row parity bits is determined using parity row minterms corresponding to every other $2^j$ row(s) of the parity matrix.

7. The IC of claim 6, further comprising:
   a decoder configured to receive read data that are read from the memory cell array of the memory, the decoder including:
   a second matrix circuit configured to arrange data bits and parity bits of the read data according to the matrix format to generate a syndrome matrix;
   a syndrome circuit including a fourth set of logic gates configured to generate a plurality of syndrome row minterms corresponding to rows of the syndrome matrix respectively, a fifth set of logic gates configured to generate a plurality of syndrome column minterms corresponding to columns of the syndrome matrix respectively and a sixth set of logic gates configured to generate at least some syndrome bits using the syndrome row and column minterms; and
   an error detection and correction circuit configured to decode the read data to generate decoded read data according to the at least some syndrome bits.

8. The IC of claim 7, where the syndrome circuit is configured to:
   generate a third number of local column syndrome bits using the plurality of syndrome column minterms;
   generate a fourth number of local row syndrome bits using the plurality of syndrome row minterms; and
   generate an overall syndrome bit using the plurality of syndrome column minterms.

9. The IC of claim 8, wherein the error detection and correction circuit is configured to detect a single bit error in read data and in response, correct the single bit error using the at least some syndrome bits.

10. A method, comprising:
   receiving, at an encoder of an integrated circuit (IC), input data including a plurality of data bits;
   arranging, using a matrix circuit, the data bits according to a matrix format to generate a parity matrix having a first set of matrix cells including the plurality of data bits and a second set of matrix cells corresponding to parity bits;
   determining, using a first set of logic gates, a plurality of parity row minterms corresponding to rows of the parity matrix respectively;
   determining, using a second set of logic gates, a plurality of parity column minterms corresponding to columns of the parity matrix respectively;
   determining, using a third set of logic gates, at least some of the parity bits using the parity row and column minterms, and after the determining the at least some of the parity bits, writing the at least some of the parity bits into the second set of matrix cells; and
   providing write data including the data bits and the parity bits to a write circuit, wherein the write circuit writes the write data to a memory cell array in a memory, and wherein the matrix format is configured based on a width of the memory to provide alignment between the write data and the memory.

11. The method of claim 10, wherein the matrix format is configured based on a first total number of the parity bits and a second total number of the data bits, such that the data bits and parity bits are arranged in the matrix format in a symmetric manner.

12. The method of claim 11, wherein the parity bits include:
   a first number of local column parity bits;
   a second number of local row parity bits; and
   an overall parity bit; and
   wherein the matrix format is configured so that the local column parity bits are located in a parity bit row of the matrix format, and the local row parity bits are located in a parity bit row of the parity matrix.

13. The method of claim 12, wherein the first number of local column parity bits are generated using the plurality of parity column minterms;
   wherein the second number of local row parity bits are generated using the plurality of parity row minterms; and
   wherein the overall parity bit is generated using the local column parity bits, the local row parity bits, and the plurality of parity column minterms.

14. The method of claim 12, wherein a difference between the first number and the second number is equal to or less than one.

15. The method of claim 14, wherein an $i^{th}$ local column parity bit of the first number of local column parity bits is generated using parity column minterms corresponding to every other $2^i$ column(s) of the parity matrix; and
   wherein a $j^{th}$ local row parity bit of the second number of local row parity bits is determined using parity row minterms corresponding to every other $2^j$ row(s) of the parity matrix.

16. The method of claim 15, further comprising:
   receiving read data that are read from the memory cell array of the memory;
   arranging data bits and parity bits of the read data according to the matrix format to generate a syndrome matrix;
   generating a plurality of syndrome row minterms corresponding to rows of the syndrome matrix respectively;
   generating a plurality of syndrome column minterms corresponding to columns of the syndrome matrix respectively;
   generating syndrome bits using the syndrome row and column minterms; and
   decoding the read data to generate decoded read data according to the syndrome bits.

17. The method of claim 16, further comprising:
   generating a third number of local column syndrome bits using the plurality of syndrome column minterms;
   generating a fourth number of local row syndrome bits using the plurality of syndrome row minterms; and
   generating an overall syndrome bit using the plurality of syndrome column minterms.

18. The method of claim 17, further comprising:
   detecting a single bit error in the read data and in response, correcting the single bit error using the syndrome bits.

19. The IC of claim 1, wherein the encoder does not include a swizzle logic circuit.

20. The method of claim 10, wherein the encoder does not include a swizzle logic circuit.

* * * * *